US009729353B2

(12) United States Patent
Stark et al.

(10) Patent No.: US 9,729,353 B2
(45) Date of Patent: Aug. 8, 2017

(54) COMMAND-DRIVEN NFA HARDWARE ENGINE THAT ENCODES MULTIPLE AUTOMATONS

(71) Applicant: Netronome Systems, Inc., Santa Clara, CA (US)

(72) Inventors: Gavin J. Stark, Cambridge (GB); Steven W. Zagorianakos, Brookline, NH (US)

(73) Assignee: Netronome Systems, Inc., Santa Clara, CA (US)

( * ) Notice: Subject to any disclaimer, the term of this patent is extended or adjusted under 35 U.S.C. 154(b) by 454 days.

(21) Appl. No.: 14/151,666

(22) Filed: Jan. 9, 2014

(65) Prior Publication Data

US 2015/0193484 A1 Jul. 9, 2015

(51) Int. Cl.

| | |
|---|---|
| ***G06F 17/30*** | (2006.01) |
| ***G11C 15/00*** | (2006.01) |
| ***G06F 9/44*** | (2006.01) |
| ***H04L 12/64*** | (2006.01) |
| *G06N 5/02* | (2006.01) |

(52) U.S. Cl.

CPC .......... *H04L 12/6418* (2013.01); *G06F 9/444* (2013.01); *G06F 17/30283* (2013.01); *G11C 15/00* (2013.01)

(58) Field of Classification Search

None

See application file for complete search history.

(56) References Cited

U.S. PATENT DOCUMENTS 6,700,809 B1 * 3/2004 Ng .......................... G11C 15/00 365/236
2003/0187633 A1 * 10/2003 Fairweather ............ G06F 8/427 704/9
2007/0038798 A1 * 2/2007 Bouchard ............... G06F 12/06 711/3
2007/0130140 A1 * 6/2007 Cytron .............. G06F 17/30985 707/999.006
2008/0071780 A1 * 3/2008 Ichiriu .............. G06F 17/30985 707/999.006
2008/0077587 A1 * 3/2008 Wyschogrod ..... G06F 17/30985
2008/0140600 A1 * 6/2008 Pandya .................... G06F 9/444 706/47
2008/0140911 A1 * 6/2008 Pandya .................... G06F 9/444 711/101
2008/0270342 A1 * 10/2008 Ruehle .............. G06F 17/30985 707/999.001
2009/0327252 A1 * 12/2009 Zhang ............... G06F 17/30463 707/999.004
2010/0198850 A1 * 8/2010 Cytron .............. G06F 17/30985 707/758
2011/0004694 A1 * 1/2011 Taylor ................. H04L 67/2823 709/230

(Continued)

*Primary Examiner* — Paulinho E Smith
*Assistant Examiner* — Benjamin Buss
(74) *Attorney, Agent, or Firm* — Imperium Patent Works LLP; T. Lester Wallace; Mark D. Marrello

(57) ABSTRACT

An NFA hardware engine includes a pipeline and a controller. The pipeline includes a plurality of stages, where one of the stages includes a transition table. Both a first automaton and a second automaton are encoded in the same transition table. The controller receives NFA engine commands onto the NFA engine and controls the pipeline in response to the NFA engine commands.

28 Claims, 30 Drawing Sheets

TRANSITION TABLE (NFA #1 & NFA #2)

(56) References Cited

U.S. PATENT DOCUMENTS

| | | | | |
|---|---|---|---|---|
| 2011/0022617 | A1* | 1/2011 | Yamagaki | G06F 7/02 707/758 |
| 2013/0018835 | A1* | 1/2013 | Pandya | G06F 17/30985 706/46 |
| 2013/0086017 | A1* | 4/2013 | Chao | G06F 17/30946 707/698 |
| 2014/0101185 | A1* | 4/2014 | Ruehle | G06F 17/30985 707/758 |
| 2014/0317134 | A1* | 10/2014 | Chen | G06F 17/30985 707/758 |

* cited by examiner

ME ISLAND

CLUSTER LOCAL SCRATCH

EXECUTE STAGE OF CLS PIPELINE

SSB PERIPHERALS BLOCK

EVENT MANAGER
("EVENT RING CIRCUIT")

NFA ENGINE AND SRAM

NFA ENGINE CONFIG COMMAND

NFA ENGINE GO COMMAND

NFA ENGINE EVENT GENERATE COMMAND

NFA PIPELINE

NFA PIPELINE

HARDWARE BYTE CHARACTERIZER

BYTE DETECTORS

TCAM MATCH

EQUAL EITHER

RE_MATCH

CONTROL MATCH

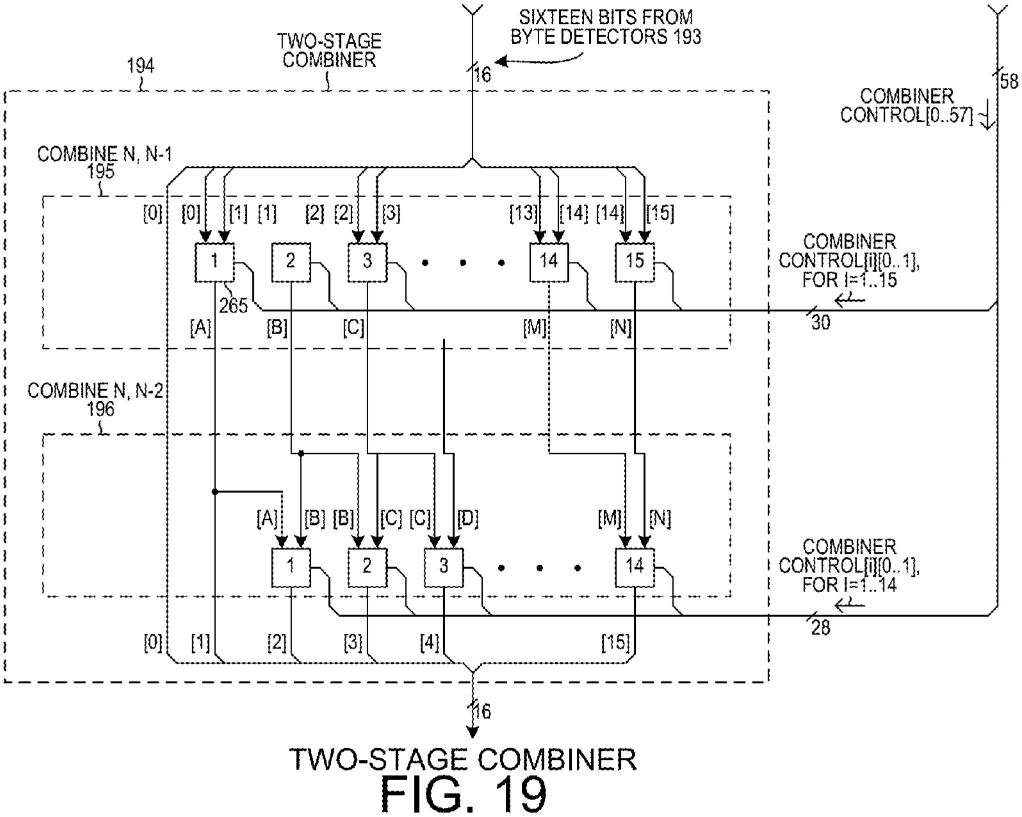
TWO-STAGE COMBINER
FIG. 19
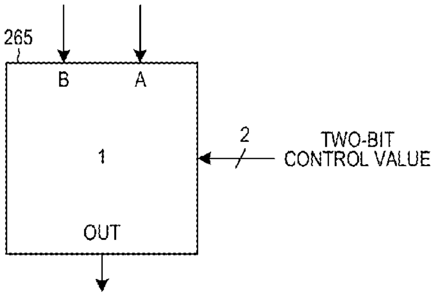
COMBINER CELL
FIG. 20
| TWO-BIT CONTROL VALUE | | OUT |
|---|---|---|
| 0 | 0 | A |
| 0 | 1 | $\overline{A}$ |
| 1 | 0 | A * B |
| 1 | 1 | $\overline{A * B}$ |
COMBINER CELL TRUTH TABLE
FIG. 21

OPERATION OF ME AND NFA'S IN ONE SPECIFIC EXAMPLE OF THE PARSING OF AN HTTP GET

OPERATION OF ME AND NFA'S IN ONE SPECIFIC EXAMPLE OF THE PARSING OF AN HTTP GET

OPERATION OF ME AND NFA'S IN ONE SPECIFIC EXAMPLE OF THE PARSING OF AN HTTP GET

CONFIG INFORMATION IN SRAM
(FOR NFA #1 & NFA #2)

TRANSITION TABLE (NFA #1 & NFA #2)

GRAPH OF NFA #1

GRAPH OF NFA #2

ETHERNET FRAME (PACKET) THAT CONTAINS A HTTP GET MESSAGE

BYTE STREAM AS PROCESSED BY NFA #1

PRIOR NFA STATE FROM WHICH THE TRANSITION CAUSED A RESULT

OFFSET FROM BEGINNING OF PARSED STREAM

| STATE (4 BITS) | BYTE OFFSET (12 BITS) |
|---|---|
| 4 | 3 |
| 5 | 45 |
| 5 | 64 |
| 9 | 68 |
| 5 | 82 |
| 5 | 84 |
| F | FF |

FF INDICATES THE PRIOR LISTING WAS THE LAST RESULT VALUE

EXAMPLE RESULT VALUES FOR NFA #1

FIG. 29

PRIOR NFA STATE FROM WHICH THE TRANSITION CAUSED A RESULT

OFFSET FROM BEGINNING OF PARSED STREAM

| STATE (4 BITS) | BYTE OFFSET (12 BITS) |
|---|---|
| 10 | 5 |
| 10 | 6 |
| 10 | 18 |
| 10 | 21 |
| 10 | 25 |
| F | FF |

FF INDICATES THE PRIOR LISTING WAS THE LAST RESULT VALUE

EXAMPLE RESULT VALUES FOR NFA #2

FIG. 34

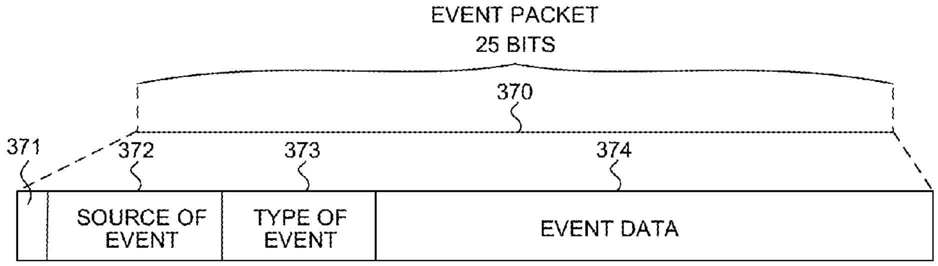

EVENT PACKET BIT SEQUENCE
FIG. 30

375

| FIELD | WIDTH | DESCRIPTION |
|---|---|---|
| VACANCY INDICATOR | 1 | REFERENCE BIT THAT INDICATES WHETHER THE SEGMENT ON THE LOCAL EVENT RING IS VACANT OR OCCUPIED. (0 = EVENT PACKET PRESENT, 1 = VACANT) |
| SOURCE OF EVENT | 8 | ADDRESS OF THE EVENT RING CIRCUIT THAT INSERTED THE EVENT PACKET INTO THE LOCAL EVENT RING. |
| TYPE OF EVENT | 4 | A FIELD THAT MAY INDICATE IF THE EVENT PACKET SHOULD BE INSERTED IN THE GLOBAL EVENT CHAIN. |
| EVENT DATA | 12 | INFORMATION REGARDING THE EVENT. (E.G. NOTIFICATION THAT A PARTICULAR NFA RESULT HAS BEEN GENERATED) |

EVENT PACKET TABLE
FIG. 31

376

| FIELD | WIDTH | DESCRIPTION |
|---|---|---|
| DATA_IS_PULL | 1 | DEASSERTED FOR PUSH DATA. |
| DATA_MASTER | 4 | PUSH ID WITHIN THE ISLAND OF DATA MASTER THE DATA IS DESTINED FOR. |
| DATA_REF | 14 | REFERENCE WITHIN DATA MASTER AS TO WHERE TO PUSH FROM. |
| SIGNAL_MASTER | 8 | FOR CTM AS A DATA MASTER ONLY THIS IS AN EXTENSION FOR DATA_REF; FOR OTHER MASTERS INDICATING WHICH MASTER WITHIN THE DATA MASTER'S ISLAND SHOULD BE SIGNALED WHEN THE LAST DATA IS PUSHED. |
| SIGNAL_REF | 7 | REFERENCE WITHIN THE SIGNAL MASTER AS TO WHICH SIGNAL SHOULD BE INDICATED WITH THE LAST PUSH DATA. |
| LAST | 1 | ASSERTED WITH THE LAST WORD OF PUSH DATA. |
| DATA | 64 | 64-BITS OF PUSH DATA FROM THE DATA MASTER. |
| DATA_ERROR | 2 | ONE BIT PER 32-BITS OF PUSHED DATA TO INDICATE AN UNCORRECTABLE ERROR FROM THE DATA_MASTER DATA SOURCE. |
| DATA_VALID | 2 | ONE BIT PER 32-BITS OF DATA TO INDICATE THAT THE DATA IS TO BE WRITTEN TO THE DATA_MASTER. |
| NO_SPLIT | 1 | ASSERTED FOR SIGNALING TO INDICATE THAT BOTH SIGNAL_REF AND SIGNAL_REF1 ARE TO BE INDICATED TO THE SIGNALED MASTER. |

DATA PAYLOAD (FOR A PUSH)

FIG. 32

BYTE STREAM AS PROCESSED BY NFA #2

ONE WAY TO INDEX AN NFA TRANSITION TABLE

ANOTHER WAY TO INDEX AN NFA TRANSITION TABLE

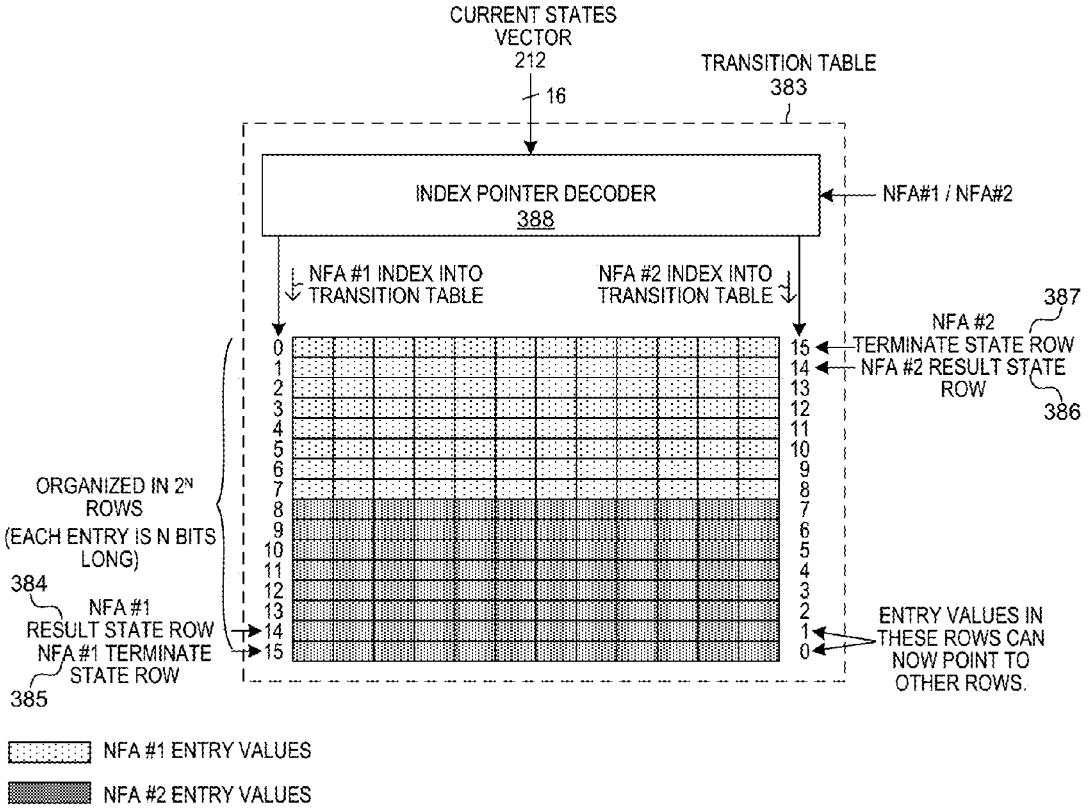

*INVERTED INDEXING INTO THE TABLE SIMPLIFIES PROGRAMMING BECAUSE TERMINATE STATE ROWS AND RESULT STATE ROWS HAVE THE SAME ROW INDEX NUMBERS FOR BOTH NFA #1 AND NFA #2.

*STORING MULTIPLE NFAS IN A SINGLE TRANSITION TABLE WHERE THE TWO NFA HAVE INVERTED INDEXING WITH RESPECT TO ONE ANOTHER ALLOWS THE USE OF EACH ROW IN THE TRANSITION TABLE TO POINT TO OTHER ROWS.

MEMORY-EFFICIENT INDEXING OF MULTIPLE NFAS IN A SINGLE TRANSITION TABLE

FIG. 37

COMMAND-DRIVEN NFA HARDWARE ENGINE THAT ENCODES MULTIPLE AUTOMATONS

TECHNICAL FIELD

The described embodiments relate generally to automaton hardware engines.

BACKGROUND INFORMATION

A network processor is a device that executes programs to handle packet traffic in a data network. A network processor is also often referred to as a network flow processor or simply a flow processor. Examples include network processor integrated circuits employed in routers and in other network equipment. Ways of improving network processors are sought.

SUMMARY

In a first novel aspect, an automaton hardware engine employs a transition table organized into $2^n$ rows, where each row comprises a plurality of n-bit storage locations, and where each storage location can store at most one n-bit entry value. Each row corresponds to an automaton state. In one example, at least two NFAs (Non-deterministic Finite Automatons) are encoded into the table. The first NFA is indexed into the rows of the transition table in a first way, and the second NFA is indexed into the rows of the transition table in a second way. Due to this indexing, all rows are usable to store entry values that point to other rows.

In a second novel aspect, an NFA hardware engine includes a pipeline and a controller. The pipeline includes a plurality of stages, where one of the stages includes an automaton transition table. Both a first automaton and a second automaton are encoded in the same transition table. The controller receives NFA engine commands onto the NFA engine and controls the pipeline in response to the NFA engine commands.

In a third novel aspect, a remote processor interacts with a transactional memory. The transactional memory (for example, a Cluster Local Scratch block of a ME island) includes a memory, a local BWC (Byte-Wise Compare) circuit, and local NFA engine resources. The processor causes a byte stream to be transferred into the transactional memory, and more specifically into the memory. The processor then uses the BWC circuit to find a character signature in the byte stream. The processor obtains information about the character signature from the BWC circuit, and based on the information uses the NFA engine to process the byte stream starting at a byte position determined based at least in part on the results of the BWC circuit. From the time the byte stream is initially written into the transactional memory (into the Cluster Local Scratch block) until the time the NFA engine completes, the byte stream is not read out of the transactional memory (out of the Cluster Local Scratch block).

In a fourth novel aspect, an NFA byte detector circuit includes a hardware byte characterizer, a first matching circuit (that performs a TCAM match function), a second matching circuit (that performs a wide match function), a multiplexer that outputs a selected output from either the first or second matching circuits, and a storage device. The storage device includes a first plurality of N storage locations, a second plurality of O storage locations, and a third plurality of P storage locations. N data values stored in the first storage locations of the storage device are supplied to the first matching circuit as an N-bit mask value and are simultaneously supplied to the second matching circuit as N bits of an N+O-bit mask value. O data values stored in the second storage locations of the storage device are supplied to the first matching circuit as the O-bit match value and are simultaneously supplied to the second matching circuit as O bits of the N+O-bit mask value. P data values stored in the third storage locations are supplied onto the select inputs of the multiplexer.

In a fifth novel aspect, a method of notifying a processor of completion of an NFA operation involves communicating a first command across a bus to an NFA engine. The first command is an instruction to the NFA engine to perform the NFA operation. The processor then communicates a second command across the bus to the NFA engine. The second command is an instruction to the NFA engine to return a reference value. The NFA engine carries out the first and second commands in order. As a result of carrying out the first command, the NFA engine performs the NFA operation, generates a result, and stores the result in a memory. As a result of carrying out the second command, the NFA engine writes the reference value across the bus, thereby informing the processor that the NFA has completed and that the results are available.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIGS. 12A and 12B form complete FIG. 12 in combination.

FIG. 19 is a diagram of the two-stage combiner in the NFA pipeline of FIG. 12.

FIG. 20 is a diagram of a combiner cell in the two-stage combiner of FIG. 19.

FIG. 21 is a truth table for the combiner cell of FIG. 20.

FIGS. 22A, 22B, and 22C form complete FIG. 22 in combination.

FIG. 29 is a diagram that illustrates a list of result values output by NFA#1.

FIG. 30 is a diagram of an event packet, such as is generated as a result of completion of NFA#1.

FIG. 31 is a diagram that describes the various fields of the event packet of FIG. 30.

FIG. 32 is a diagram of the data payload of a CPP bus push.

FIG. 34 is a diagram that illustrates a list of result values output by NFA#2.

FIG. 37 is a diagram that illustrates a memory-efficient indexing of multiple NFAs in a single transition table in accordance with one novel aspect.

DETAILED DESCRIPTION

Reference will now be made in detail to background examples and some embodiments of the invention, examples of which are illustrated in the accompanying drawings. In the description and claims below, relational terms such as "top", "down", "upper", "lower", "top", "bottom", "left" and "right" may be used to describe relative orientations between different parts of a structure being described, and it is to be understood that the overall structure being described can actually be oriented in any way in three-dimensional space.

Figure 1:
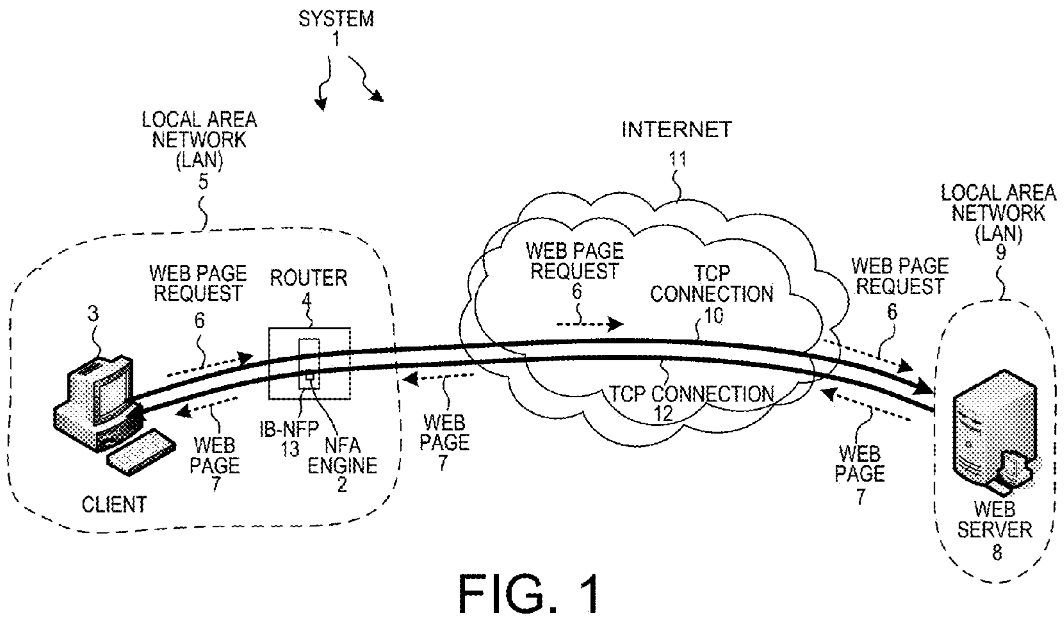
FIG. 1 is diagram of a system involving a router, where the router includes a novel Non-deterministic Finite Automaton (NFA) engine.

FIG. 1 is a diagram of a system 1 involving a Non-deterministic Finite Automaton (NFA) engine 2 in accordance with one novel aspect. System 1 includes a client device 3 and a router 4 that are on the same Local Area Network (LAN) 5. The client device 3 issues an HTTP GET request 6 in order to download a web page. The web page 7 is stored on a web server 8 on another LAN 9. The HTTP GET request 6 is to be communicated across a TCP connection 10 from the client device 3, through the router 4, through the internet 11, to the web server 8. The web server 8 is to respond by sending back the requested web page across another TCP connection 12. In this example, certain files are known to be or to contain viruses. The router 4 parses the HTTP GET request 6 as the request passes through the router 4. If the leaf (file) of the requested page is determined to be one of a set of files that is known to contain a virus, then the router 4 performs exception processing on the outgoing HTTP GET request. For example, the router 4 may block the HTTP GET request so that it is not sent out from the router 4 to the internet. Alternatively, the router 4 may block the returning web page from being passed back to the client device 3. In this particular example, the router 4 includes a line card and a management card that fit into and attach to a backplane. The line card includes optics transceivers, physical layer interface circuits (PHYs), an instance of a novel Island-Based Network Flow Processor (IB-NFP) integrated circuit 13, associated memory circuits, and other circuitry. The NFA engine 2 is a part of the IB-NFP integrated circuit 13 on the line card.

Figure 2:
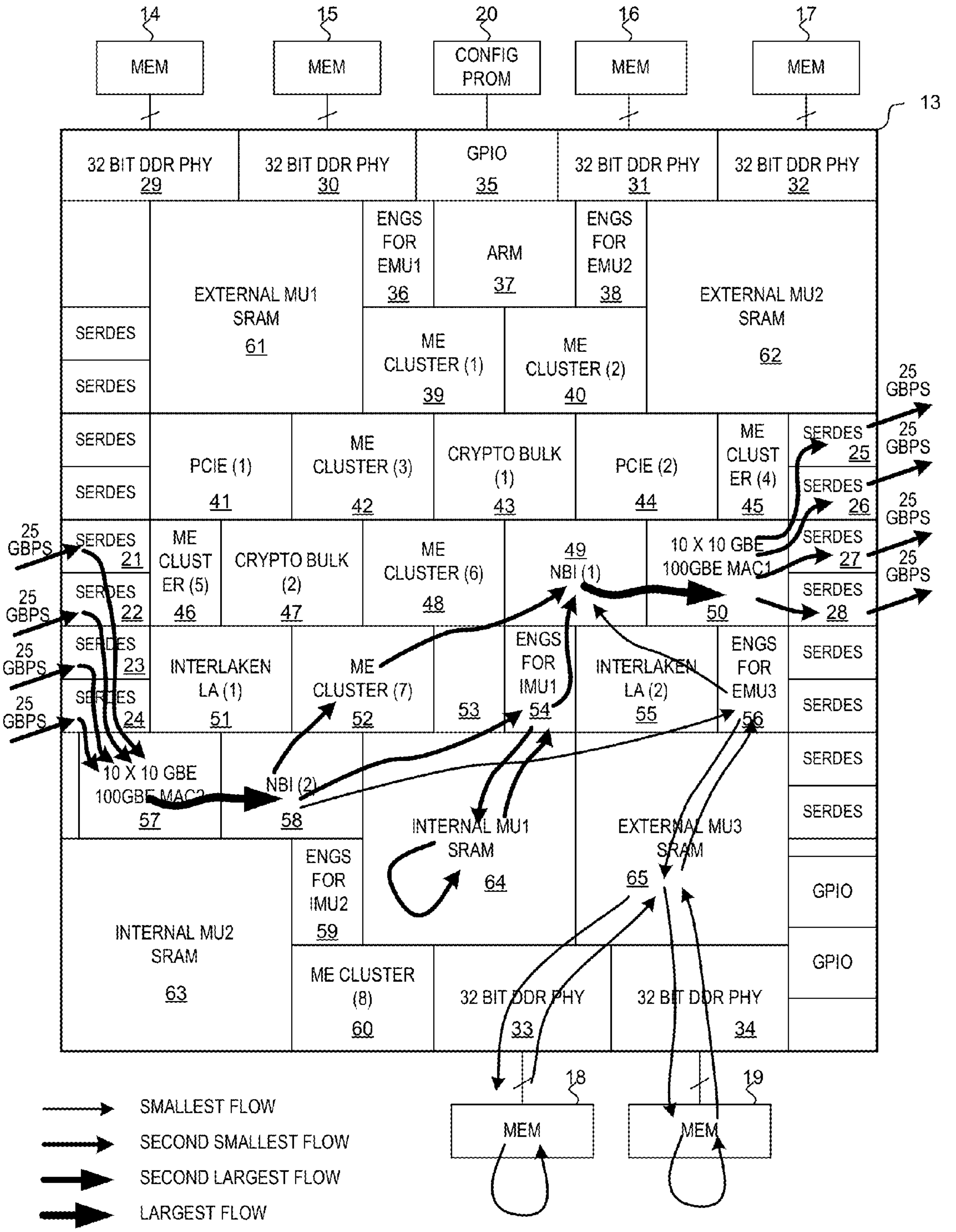
FIG. 2 is a top-down diagram of the IB-NFP integrated circuit and associated memory circuits in the router of FIG. 1.

FIG. 2 is a top-down diagram of the IB-NFP integrated circuit 13 and associated memory circuits 14-19 in the router application of FIG. 1. SerDes circuits 21-24 are the first set of four SerDes circuits that are used to communicate with external networks via optical cables. SerDes circuits 25-28 are the second set of four SerDes circuits that are used to communicate with the switch fabric of the backplane (not shown) of the router 4. Each of these SerDes circuits is duplex in that it has a SerDes connection for receiving information and it also has a SerDes connection for transmitting information. Each of these SerDes circuits can communicate packet data in both directions simultaneously at a sustained rate of 25 Gbps. IB-NFP integrated circuit 13 accesses external memory integrated circuits 14-19 via corresponding 32-bit DDR physical interfaces 29-34, respectively. IB-NFP integrated circuit 13 also has several general purpose input/output (GPIO) interfaces. One of these GPIO interfaces 35 is used to access external PROM 20.

In addition to the area of the input/output circuits outlined above, the IB-NFP integrated circuit 13 also includes two additional areas. The first additional area is a tiling area of islands 36-60. Each of the islands is either of a full rectangular shape, or is half the size of the full rectangular shape. For example, the island 41 labeled "PCIE (1)" is a full island. The island 46 below it labeled "ME CLUSTER (5)" is a half island. The functional circuits in the various islands of this tiling area are interconnected by: 1) a configurable mesh Command/Push/Pull (CPP) data bus, 2) a configurable mesh control bus (CB), and 3) a configurable mesh event bus (EB). Each such mesh bus extends over the two-dimensional space of islands with a regular grid or "mesh" pattern. For additional information on the CPP data bus, the control bus, and the event bus, see: U.S. patent application Ser. No. 13/399,433, entitled "Staggered Island Structure in an Island-Based Network Flow Processor," filed on Feb. 17, 2012 (the entire subject matter of which is incorporated herein by reference).

In addition to this tiling area of islands 36-60, there is a second additional area of larger sized blocks 61-65. The functional circuitry of each of these blocks is not laid out to consist of islands and half-islands in the way that the circuitry of islands 36-60 is laid out. The mesh bus structures do not extend into or over any of these larger blocks. The mesh bus structures do not extend outside of islands 36-60. The functional circuitry of a larger sized block may connect by direct dedicated connections to an interface island and through the interface island achieve connectivity to the mesh buses and other islands.

The arrows in FIG. 2 illustrate operation of the IB-NFP integrated circuit 13 within the router 4 of FIG. 1. 100 Gbps packet traffic is received onto the line card of the router via an optical cable (not shown), flows through an optics transceiver (not shown) on the line card, flows through a PHY integrated circuit (not shown), is received onto IB-NFP integrated circuit 13, and is spread across the four SerDes I/O blocks 21-24. Twelve virtual input ports are provided at this interface. The symbols pass through direct dedicated conductors from the SerDes blocks 21-24 to ingress MAC island 57. Ingress MAC island 57 converts successive symbols delivered by the physical coding layer into packets by mapping symbols to octets, by performing packet framing, and then by buffering the resulting packets for subsequent communication to other processing circuitry. The packets are communicated from MAC island 57 across a private inter-island bus to ingress NBI (Network Bus Interface) island 58. In addition to the optical cable that supplies packet traffic into the IB-NFP integrated circuit from the router, there is another optical cable that communicates packet traffic in the other direction out of the IB-NFP integrated circuit and to the router.

For each packet received onto the IB-NFP 13, the functional circuitry of ingress NBI island 58 examines fields in the header portion of the packet to determine what storage strategy to use to place the payload of the packet into memory. In one example, NBI island 58 examines the header portion and from that determines whether the packet is an exception packet or whether the packet is a fast-path packet. If the packet is an exception packet then the ingress NBI island 58 determines a first storage strategy to be used to store the packet so that relatively involved exception processing can be performed efficiently, whereas if the packet is a fast-path packet then the ingress NBI island 58 determines a second storage strategy to be used to store the packet for more efficient transmission of the packet from the IB-NFP. Ingress NBI island 58 examines the packet headers of the header portion, performs packet preclassification, determines that the packet is a fast-path packet, and determines that the header portion of the packet should be placed into a CTM (Cluster Target Memory) in ME (Microengine) island 52. The header portion of the packet is therefore communicated across the configurable mesh data bus from ingress NBI island 58 to ME island 52. The CTM is tightly coupled to microengines in the ME island 52. The ME island 52 determines header modification and queuing strategy for the packet based on the packet flow (derived from packet header and contents) and the ME island 52 informs a second NBI island 49 of these. The payload portions of fast-path packets are placed into internal SRAM (Static Random Access Memory) MU block 64. The payload portions of exception packets are placed into external DRAM 18 and 19.

Half island 54 is an interface island through which all information passing into, and out of, SRAM MU block 64 passes. The functional circuitry within half island 54 serves as the interface and control circuitry for the SRAM within block 64. For simplicity purposes in the discussion below, both half island 54 and MU block 64 may be referred to together as the MU island, although it is to be understood that MU block 64 is actually not an island as the term is used here but rather is a block. The payload portion of the incoming fast-path packet is communicated from ingress NBI island 58, across the configurable mesh data bus to SRAM control island 54, and from control island 54, to the interface circuitry in block 64, and to the internal SRAM circuitry of block 64. The internal SRAM of block 64 stores the payloads of the fast-path packets so that they can be accessed for flow determination by the ME island.

In addition, a preclassifier in the ingress NBI island 58 determines that the payload portions for others of the packets should be stored in external DRAM 18 and 19. For example, the payload portions for exception packets are stored in external DRAM 18 and 19. The data payload for the HTTP GET message described in connection with FIG. 1 is one such data payload of an exception packet. Interface island 56, external MU SRAM block 65, and DDR PHY I/O blocks 33 and 34 serve as the interface and control for external DRAM integrated circuits 18 and 19. The payload portions of exception packets are therefore communicated across the configurable mesh data bus from ingress NBI island 58, to interface and control island 56, to external MU SRAM block 65, to 32-bit DDR PHY I/O blocks 33 and 34, and to external DRAM integrated circuits 18 and 19.

At this point in the operational example, the packet header portions and their associated payload portions are stored in different places. The payload portions of fast-path packets are stored in internal SRAM in MU block 64, whereas the payload portions of exception packets are stored in external DRAMs 18 and 19. The header portions of all packets are stored in CTM 66 in ME island 52. In the example of the HTTP GET message, the header portion is then further examined by circuitry of the ME island 52, including the NFA engine 2 of the ME island 52. The NFA engine can autonomously read and write SRAM memory unit 84.

When the packets are to be sent out of the IB-NFP, the ME island 52 informs egress NBI island 49 where the packet headers and the packet payloads can be found and provides the egress NBI island 49 with an egress packet descriptor for each packet. The egress packet descriptor indicates a queuing strategy to be used on the packet. The egress NBI island 49 uses the egress packet descriptor to read the packet headers and any header modification from ME island 52 and to read the packet payloads from either internal SRAM 64 or external DRAMs 18 and 19. The egress NBI island 49 places packet descriptors for packets to be output into the correct order. For each packet that is then scheduled to be transmitted, the egress NBI island 49 uses the packet descriptor to obtain the header portion and any header modification and the payload portion and to assemble the packet to be transmitted. The header modification is not actually part of the egress packet descriptor, but rather it is stored with the packet header by the ME when the packet is presented to the NBI. The egress NBI island 49 then performs any indicated packet modification on the packet. The resulting modified packet then passes from the egress NBI island 49 and to the egress MAC island 50. Egress MAC island 50 buffers the packets, and converts them into symbols. The symbols are then delivered by conductors from the MAC island 50 to the four SerDes I/O blocks 25-28. From SerDes I/O blocks 25-28, the 100 Gbps outgoing packet flow passes out of the IB-NFP integrated circuit 13 and to the switch fabric (not shown) of the router.

Figure 3:
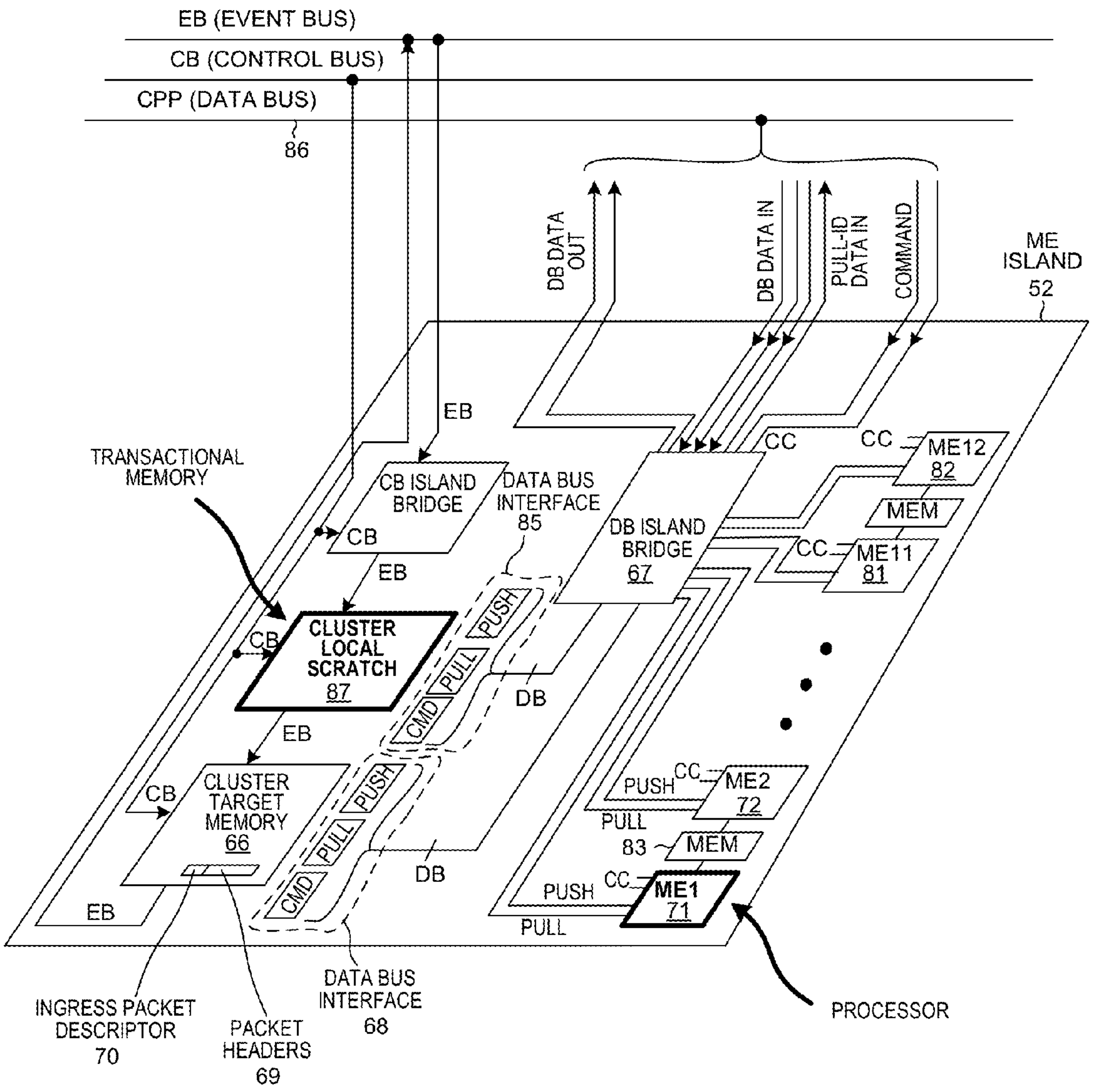
FIG. 3 is a diagram of a microengine (ME) island in the IB-NFP integrated circuit of FIG. 2.

FIG. 3 is a diagram of the microengine (ME) island 52. In the operational flow of FIG. 1 involving the HTTP GET message, the packet headers 69 (also referred to as the header portion of the packet) and the associated preclassification results 70 are DMA transferred from the ingress NBI island 58 across the CPP bus 86 and into the Cluster Target Memory (CTM) 66 of ME island 52. A DMA engine in the ingress NBI island 58 is the master of this bus transaction and the CTM 66 in ME island 52 is the target of this bus transaction. The packet headers 69 and the associated ingress packet descriptor 70 pass into the ME island 52 via data bus island bridge 67 and data bus interface circuitry 68. As mentioned above, once the packet headers 69 of the exception HTTP GET message are stored in the CTM 66, the packet headers are analyzed under the control of one of the microengines 71-82, for example, microengine ME1 71. The microengines have, through the DB island bridge 67, a command out interface, a pull-id in interface, a pull-data out interface, and a push data in interface. The microengines can therefore engage in CPP bus transactions with the CTM 66 and with the CLS 87. There are six pairs of microengines, with each pair sharing a memory containing program code for the microengines. Reference numerals 71 and 72 identify the first pair of microengines and reference numeral 83 identifies the shared memory.

In the present example, the packet headers 69 of the packet containing the HTTP GET message are stored in CTM 66. Microengine 71 causes these packet headers 69 to be moved from CTM 66 into an SRAM memory unit 84 located in a transactional memory 87 of the ME island 52. The transactional memory 87 is referred to as the Cluster Local Scratch (CLS). The microengine 71 performs this data move by accessing the CTM 66 via BD island bridge 67 and CPP data bus interface 68, and by accessing the CLS 87 via the DB island bridge 67 and CPP data bus interface 85. The ME 71 reads from the CTM and writes to the CLS using CPP bus transactions just as if the CTM and CLS were located on another island, except that the destination values of the CPP bus transactions indicate that the CTM and CLS are local and are located on the same island as the microengine 71. For further detail on how an ME located in an island can act as a CPP bus master and engage in CPP bus transactions with another device located on the same island acting as a CPP bus target, see: U.S. patent application Ser. No. 13/399,433, entitled "Staggered Island Structure in an Island-Based Network Flow Processor," filed on Feb. 17, 2012 (the entire subject matter of which is incorporated herein by reference).

The CLS 87 includes the novel NFA engine 2 mentioned above in connection with FIG. 1. As explained in further detail below, NFA engine 2 analyzes the packet headers 69 at the direction of the ME 71. As a result of this analysis, the ingress packet descriptor 70 is modified and converted into an egress packet descriptor. The egress packet descriptor includes: 1) an address indicating where and in which ME island the header portion is found, 2) an address indicating where and in which MU island the payload portion is found, 3) how long the packet is, 4) sequence number of the packet in the flow, 5) an indication of which queue the packet belongs to (result of the packet policy), 6) an indication of where the packet is to be sent (a result of the packet policy), 7) user metadata indicating what kind of packet it is. The ME 71 transfers the egress packet descriptor to the egress NBI island 49 so that egress processing can be performed as described above.

Figure 4:
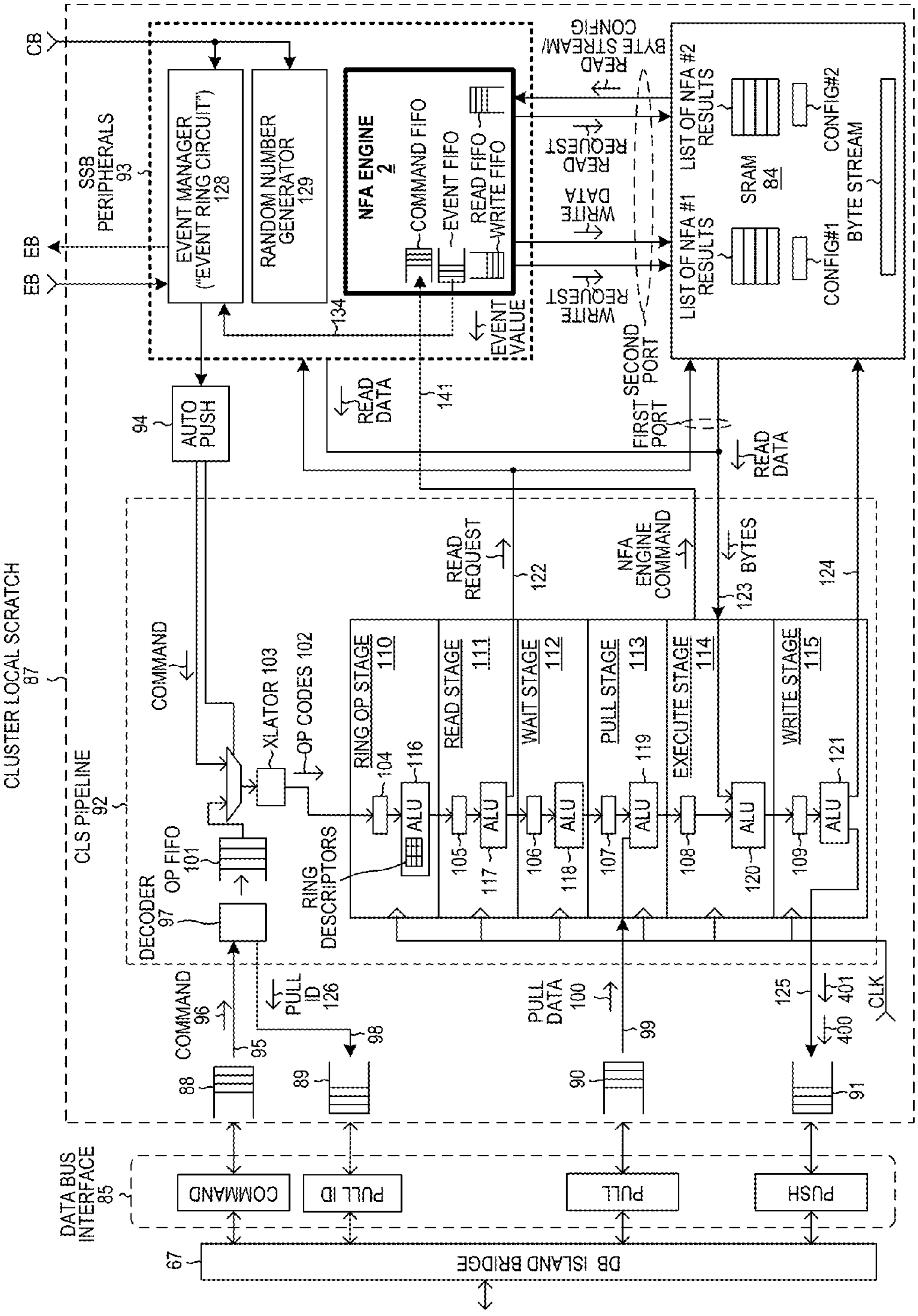
FIG. 4 is a diagram of the Cluster Local Scratch (CLS) in the ME island of FIG. 3.

FIG. 4 is a more detailed diagram of the Cluster Local Scratch (CLS) 83 of the ME island 52 of FIG. 3. CLS 87 includes a command FIFO (First In First Out) 88, a pull-id FIFO 89, a pull FIFO 90, a push FIFO 91, a CLS pipeline 92, an SSB peripherals block 93, an autopush circuit 94, and the SRAM memory unit 84. Any bus master on the CPP bus located in any island on the IB-NFP can interact across the CPP bus with the CLS pipeline 92 acting as a CPP bus target. In this way, microengine 71 writes commands into the command FIFO 88. One at a time, the commands are presented to the CLS pipeline 92 via conductors 95. Reference numeral 96 identifies one such command. For a command passing into the CLS pipeline, the decoder 97 determines if the operation specified by the command will require data to be obtained (i.e., pulled) in order for the operation to be carried out. If the result of the decoding indicates that data should be pulled, then information to generate a pull-id bus CPP transaction value is generated by the decoder 97 and is sent across conductors 98 and into pull FIFO 89. Reference numeral 126 is an example of such a pull-id that is supplied by decoder 97 to the pull FIFO 89. The data bus interface 85 uses this information from pull FIFO 89 to generate an appropriate pull-id transaction value. The pull-id transaction value is communicated via DB island bridge 67 to the master of the CPP bus transaction. The master in turn returns the pull data via DB island bridge 67 and the data bus interface 85 target. The pull data passes through pull FIFO 90 and conductors 99 back to the pipeline. Reference numeral 100 identifies an example of such pull data.

Meanwhile, after decoding by decoder 97, the command passes through operation FIFO 101 and is translated into a set of opcodes 102 by translator 103. There is one opcode for each stage of the CLS pipeline 92. Each pipeline stage has an input register or FIFO, and an amount of logic referred to here generally as an ALU. Reference numerals 104-109 identify the incoming registers for pipeline stages 110-115, respectively. Reference numerals 116-121 identify the ALUs for pipeline stages 110-115, respectively. Each opcode determines what a corresponding pipeline stage will do during the clock cycle when the command is being processed by that stage. For example, if the command is a Byte-Wise Compare (BWC) CAM operation command, then the ring operation performs no function. The BWC CAM operation is a multi-character match, and requires sixty-four bits to data to be read from the SRAM memory unit 84. The read stage 111 outputs a read request via conductors 122. After a pull-id has been posted to the DB island bridge 67 as described above, it may take a substantial period of time for the requested pull data to be returned via pull FIFO 90. The wait stage 112 is controlled by one of the opcodes to slow the pipeline long enough for the returned pull data be present on the input of the pull stage 113 at the time when processing of the command is being performed by the pull stage. In the example of the BWC CAM operation, an 8-bit value to compare against the 64-bit value read from memory 84 is to be pulled from the master. SRAM memory unit 84 is organized as 64-bit bit words, so a word read received via conductors 123 is sixty-four bits long. In the appropriate clock cycle, the op code for the execute stage 114 causes the ALU 120 of the execute stage to compare the 8-bit pull data value passed in from the pull stage via register 108 with the sixty-four bits read from the SRAM memory unit 84. The ALU 120 generates an output value. If the command requires an output value to be written to the SRAM memory unit, then the write stage 115 causes an appropriate write to occur across conductors 124. Likewise, if the command requires an output value to be returned to the CPP bus master across the DB island bridge, then the write stage 115 causes an appropriate CPP push bus transaction value to be supplied push to FIFO 91 via conductors 125. In the case of the BWC CAM operation, the output value generated by the ALU 120 of the execute stage is pushed back to the CPP bus master that originally initiated the command. The pushed back CPP bus transaction value includes a push bus transaction value that the master uses to associate the incoming push with the previously issued command. The bus interface of the master then writes the data of the push transaction into the master's memory at the appropriate location.

The stages 110-115 are pipelined. The CLS pipeline 92 of processing stages does not have an instruction counter and does not fetch and decode instructions. In a first cycle of the clock signal CLK, the ring operation stage 110 performs its functions required by the command, in a second cycle of the clock signal CLK the read stage 111 performs its function required by the command, in a third cycle of the clock signal CLK the wait stage 112 performs its function required by the command, in a fourth cycle of the clock signal CLK the pull stage 113 performs its function required by the command, in a fifth cycle of the clock signal CLK the execute stage 114 performs its function required by the command, and in a sixth cycle of the clock signal CLK the write stage 115 performs its function required by the command. A different command is output from the operation FIFO 101 each cycle of the clock signal, so one command can be executed by the pipeline each cycle. A CPP bus master can use the CPP bus to write CLS pipeline commands into the CLS pipeline 92 that cause data to be written into SRAM memory unit 84, that cause data to be read from the SSB peripherals block 93, that cause data to be read from the SRAM memory unit 84, and that cause other operations to occur.

Figure 5:
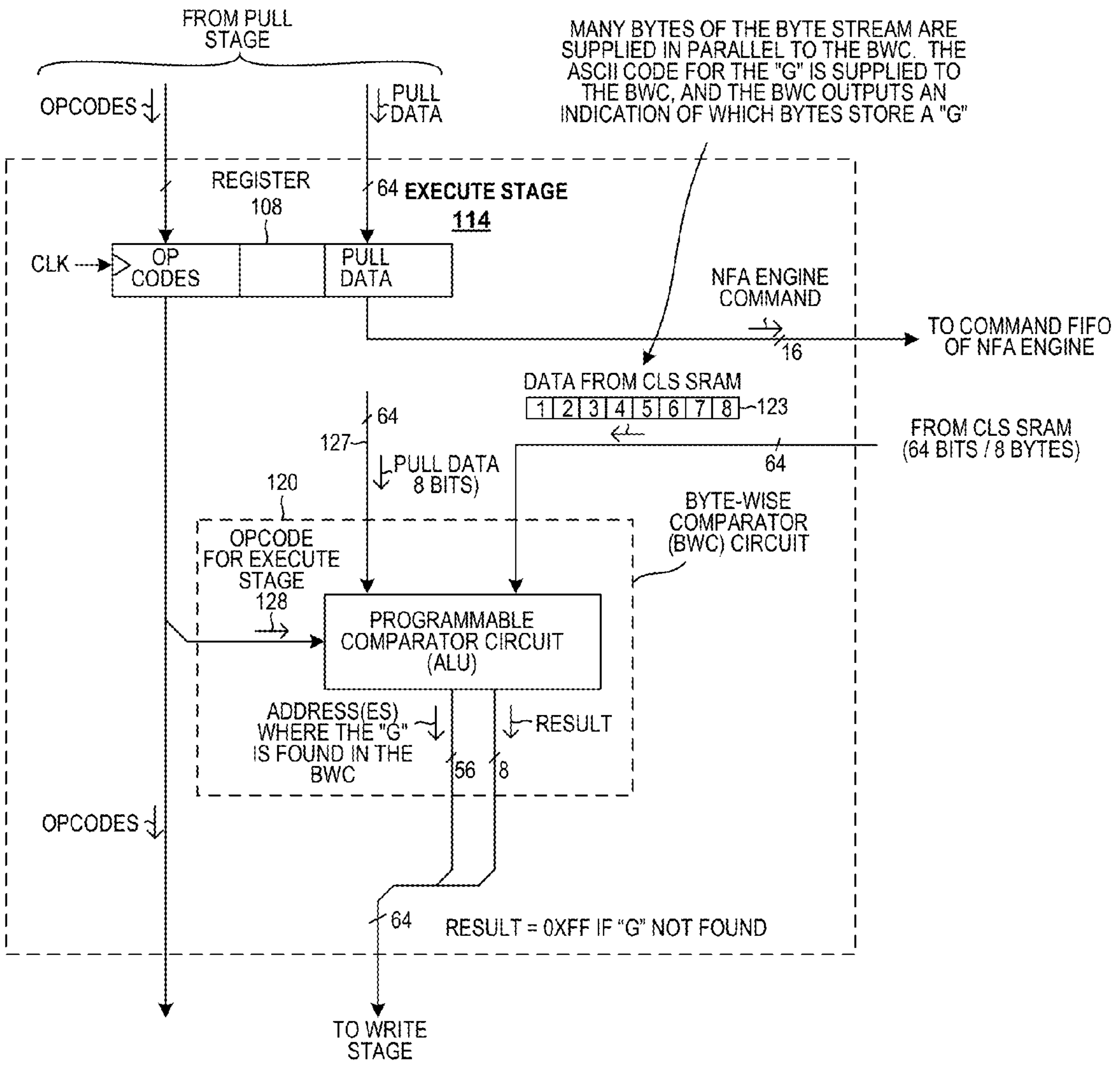
FIG. 5 is a simplified diagram of the execute stage in the CLS pipeline in the CLS of FIG. 4.

FIG. 5 is a simplified diagram of the execute stage 114 of the CLS pipeline 92. If the opcode for the execute stage has one of a plurality of values that indicate a BWC operation, then the ALU 120 of the stage is controlled to perform a Byte-Wise Comparator (BWC) operation. The ALU 120 is therefore also referred to in this instance as a Byte-Wise Comparator (BWC) circuit. The data path through the CLS pipeline is sixty-four bits wide, but only a subset of that may be used by ALU 120 in a particular command. In the case of the BWC CAM command, the eight bits of pull data that was pulled from the master as part of the pipeline command is latched into pipeline register 108 and is supplied to the BWC via conductors 127. Only part of the 64-bit data path is therefore used. The 64-bit value (eight bytes) read from SRAM 84 is supplied into the execute stage via conductors 123. If the opcode 128 for the execute stage is the correct value, then the BWC programmable comparator circuit (ALU) 120 is configured to compare the 8-bit pull data value with the sixth-four bits from SRAM 84, thereby generating sixty-four bits of output value. The eight-bit pull data value is compared in parallel with each 8-bit portion of the 64-bit SRAM value. For each of the eight 8-bit portions, there is one corresponding bit in the 56-bit value. If the bit is set, then the value of the corresponding 8-bit portion of the 64-bit SRAM value has been found to match the 8-bit pull data. If none of 8-bit portions matches the 8-bit pull data value, then the result value indicates that there was no match. An eight-bit portion of the output value indicates the first 8-bit portion that is found to match the 8-bit pull data value.

In addition to the CLS pipeline 92, the CLS 87 includes the SSB peripherals block 93. The SSB peripherals block 93 includes an event manager 128, a random number generator 129, and the novel NFA engine 2.

Figure 6:
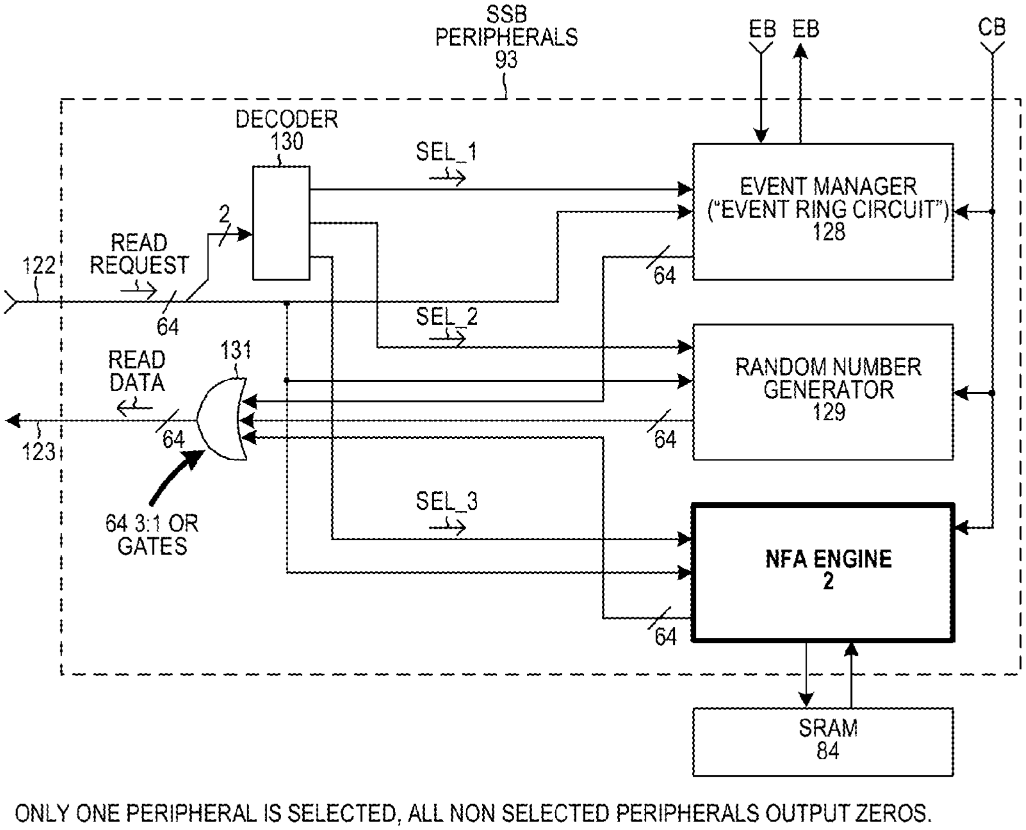
FIG. 6 is a diagram of three blocks of the SSB peripherals block of the CLS of FIG. 4.

FIG. 6 is a diagram that shows in a very simplified fashion how a selected one of the three blocks 128, 129 and 2 of the SSB peripherals block 93 can be accessed by the CLS pipeline. To read one of the blocks, the read stage of the CLS pipeline outputs a read request to the SSB peripherals block 93 via conductors 122, where the first two bits of the request identify one of the three blocks. Decoder 130 decodes the two-bit value and asserts a select signal to the appropriate one of the three blocks. The select signals are denoted SEL_1, SEL_2 and SEL_3 in the diagram. Each of the three blocks has a 64-bit output that is supplied to a set of sixty-four 3-to-1 OR gates 131. The 64-bit output of a non-selected block, however, is forced to be all zeros. Only the selected block is enabled to output a non-zero value onto its 64-bit output. The sixty-four 3-to-1 OR gates 131 therefore pass the 64-bit output value from the selected block back via conductors 123 back to the execute stage of the pipeline. Using this mechanism, a CPP bus master can use the CLS pipeline to read from a selected one of the three blocks 128, 129 and 2. A similar mechanism is provided to allow a CPP bus master to write to a selected one of the three blocks 128, 129 and 2 via the CLS pipeline.

The IB-NFP integrated circuit 13 has a configurable mesh event bus structure of event ring segments. This configurable event bus structure is configurable to form one or more event rings that pass through event manager circuits in the various islands of the integrated circuit. Event manager circuits are disposed along a ring so that event packets passing through the ring pass into and out of event manager circuits as the packet travels around the ring. An event manager can inject an event packet into the ring such that the event packet then circulates through the ring to other event manager circuits in other islands. An event manager can also monitor event packets passing through the ring. The event ring structure provides a way to communicate events and status information among event manager circuits in the various islands of the IB-NFP. For example, functional circuitry in an island can cause a local event manager to inject an event packet onto an event ring, where the event packet then travels around a ring to other islands and serves to alert other functional circuits in other islands of the event. Filters in an event manager can be programmed by functional circuitry to ignore unwanted event packets, but to detect particular event packets and to alert the functional circuitry of such particular event packets.

Figure 7:
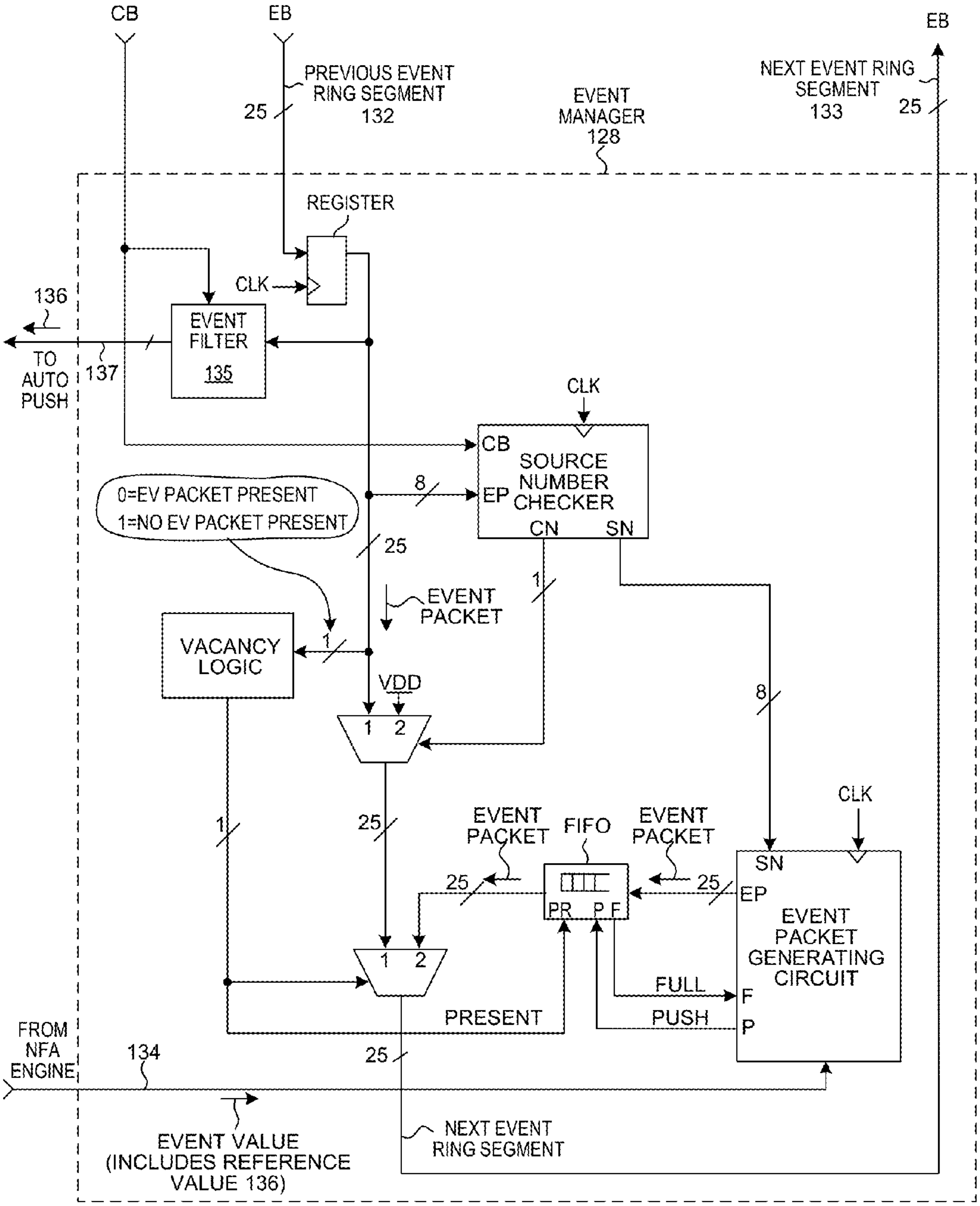
FIG. 7 is a simplified circuit diagram of the event manager in the SSB peripherals block of the CLS of FIG. 4.

FIG. 7 is a simplified diagram of the event manager 128 of the SSB peripherals block 93 of FIG. 4. Event packets that are circulating around the event ring come into the event manager via previous event ring segment 132, and exit the event manager via next event ring segment 133. Functional circuitry on the ME island (which in this case includes NFA engine 2) can send an event value (that includes a reference value 136) to the event manager 128 via conductors 134 such that the event manager 128 is made to inject an event packet onto the event ring. Functional circuitry can also program event filter block 135 so that the event manager 128 will detect particular event packets passing through the ring. When a particular type of event packet is detected, the event filter block 135 may be programmed to alert the autopush block 94 of this occurrence by sending the autopush block 94 the reference value 136 on conductors 137. For additional information on the configurable mesh event bus, how it can be configured into event rings, what event packets entail, and details on the circuitry of the event manager of FIG. 7, see: U.S. patent application 13/399,433, entitled "Staggered Island Structure in an Island-Based Network Flow Processor," filed on Feb. 17, 2012 (the entire subject matter of which is incorporated herein by reference).

Using this event bus mechanism, a CPP bus master can configure the NFA engine 2 via the CLS pipeline 92 so that when an NFA completes a particular NFA the NFA engine 2 will cause the event manager 128 to inject an event packet into the event ring, where the event packet carries a particular reference value (set up beforehand by the CPP bus master). The reference value indicates why the event packet was generated. Once the event packet has been injected into the ring, the event packet passes around the ring and upon its return is detected by the event manager 128, which in response alerts the autopush block 94 by sending the reference value (indicating why the event packet was generated). The autopush block 94 (see FIG. 4) responds by injecting a push command into the command stream going to the CLS pipeline 92. The autopush is preconfigured with address information for where (Island and Master) to push the reference value. This injected command causes the CLS pipeline 92 to push the reference value back across the CPP bus to the original CPP bus master as indicated by the autopush preconfigured address information. Because it was the CPP bus master that originally set up the NFA engine to supply the reference value to the event manager, the CPP bus master knows from the reference value received that the NFA engine was the reason for the returned reference value.

Figure 8:
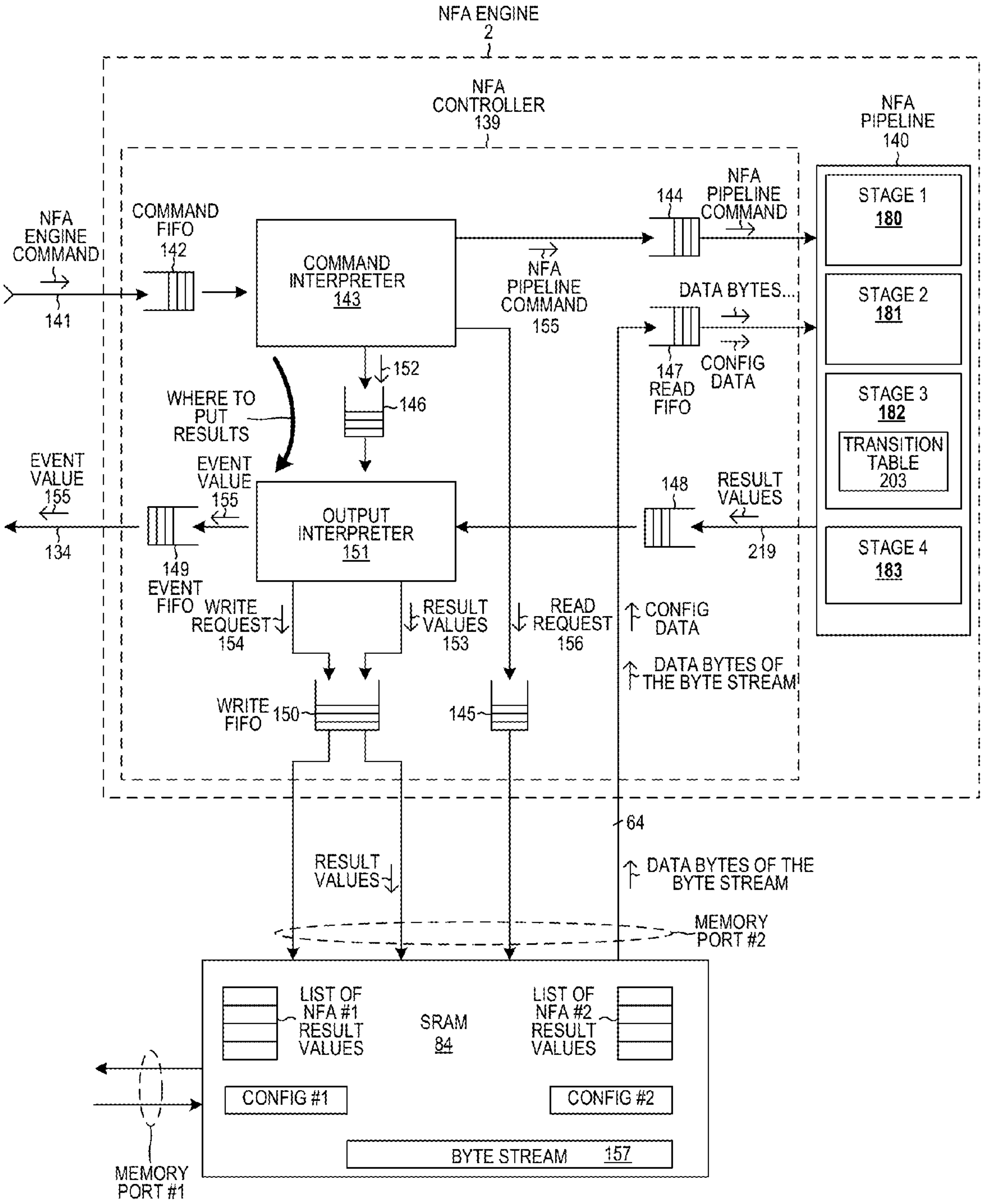
FIG. 8 is a diagram of the NFA engine of the SSB peripherals block of the CLS of FIG. 4.
Figure 9:
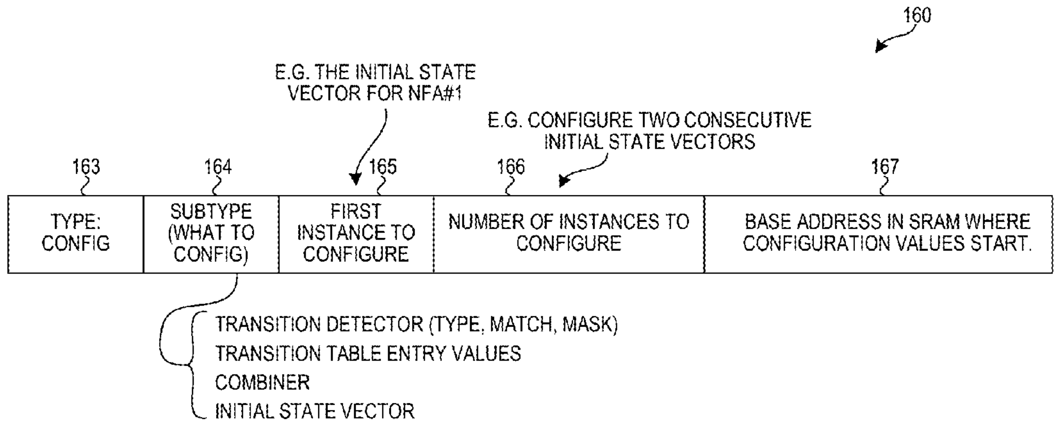
FIG. 9 is a diagram of an NFA engine config command.
Figure 10:
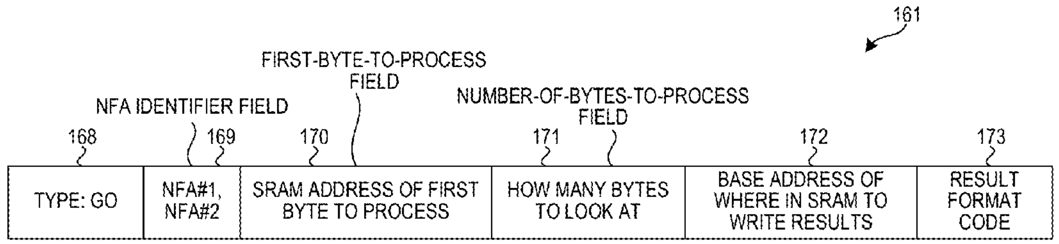
FIG. 10 is a diagram of an NFA engine go command.
Figure 11:
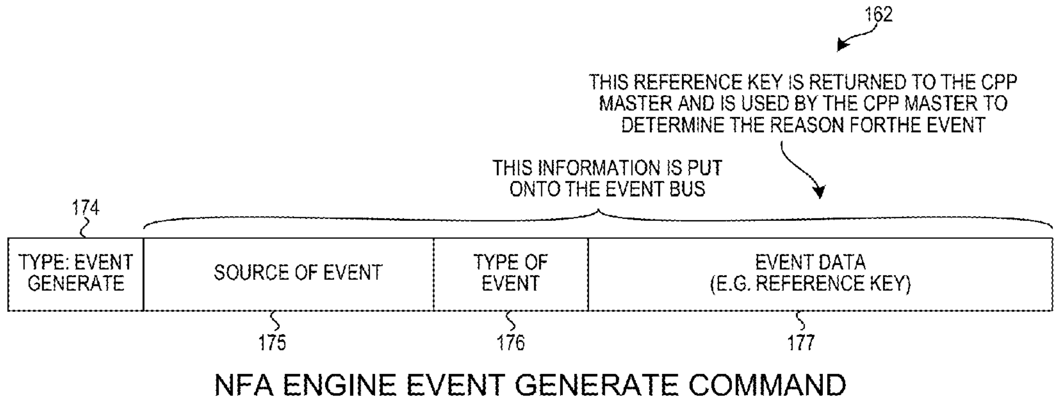
FIG. 11 is a diagram of an NFA engine event generate command.

FIG. 8 is a diagram of NFA engine 2 of the SSB peripherals block 93 of FIG. 4. NFA engine 2 includes an NFA controller 139 and an NFA pipeline 140. NFA engine 2 receives NFA engine commands from the CLS pipeline via conductors 141. NFA engine 2 sends event values to the event manager 128 via conductors 134. FIGS. 9-11 are diagrams of three types of NFA engine commands. NFA engine commands pass into the NFA engine 2 through command FIFO 142. Command interpreter 143 interprets a command and generates therefrom an NFA pipeline command 155, a read request 156 to read information (configuration information and data) used by the NFA pipeline, and information 152 on how the format and store result values. The NFA pipeline commands are supplied via FIFO 144 to the NFA pipeline 140. The read request 156 is supplied to the SRAM memory unit 84 via FIFO 145. Information read from the SRAM memory unit 84 is returned to the NFA engine 2 via read FIFO 147 and is passed to the NFA engine 2. Information read includes NFA configuration information and data for NFAs to process. The command interpreter maintains information on where in SRAM memory unit 84 the configuration information is stored and where in SRAM memory unit 84 the data (byte stream) is stored. It uses this location information to read the configuration and byte stream information out of the memory. The command interpreter 143 also handles synchronizing the NFA pipeline commands and the read data so they are supplied to the pipeline at the appropriates times. Data bytes are processed one by one through the NFA pipeline 140. When the NFA pipeline 140 generates result values, those result values pass through FIFO 148 to an output interpreter 151. The output interpreter 151 uses the information 152 on where to place the result values, and how to format the result values, to output result values 153 via write FIFO 150 to the SRAM memory unit 84. The output interpreter handles writing the result values in lists, where the lists are located in SRAM memory unit 84 at locations indicated by the NFA command. The output interpreter 151 also handles supplying the necessary write requests 154 to carry out the necessary write operations into the memory unit. In addition, if appropriate in accordance with the NFA command, the output interpreter 151 outputs an event value 155 via conductors 134 to the event manager 128 as described above.

FIG. 9 is a diagram of an NFA engine config command 160. The first field 164 of the command indicates that the command is an NFA engine config command. The second field 164 indicates what part of the NFA pipeline is to be configured. The third field 165 indicates the first instance to be configured. The fourth field 166 indicates the number of instances, starting with the first instance indicated by field 165, to be configured. The fifth field 167 indicates the base address in SRAM memory unit 84 where a complete set of configuration values for the NFA pipeline is stored. The complete set of configuration values can be considered to be a kind of data structure for NFA pipeline configuration information. For example, the subtype of an NFA engine config command may indicate that transition table entry values are to be loaded into the NFA pipeline. In such a case, the first instance identified by field 165 may indicate a first row of transition table entry values to be configured. The next field 166 may indicate the number of consecutive transition table entry values to be configured. Due to fields 165 and 166, it is possible to use only a part of the set of configuration values to configure only selected rows of a larger table of transition entry values. In the same way, if the subtype field is set appropriately, then certain transitions detectors in the NFA pipeline can be reconfigured while others of the transition detectors are not reconfigured. Similarly, one combiner can be reconfigured without reconfiguring all combiners, and some initial state vectors can be reconfigured without reconfiguring all initial state vectors. Multiple complete sets of configuration information are typically stored in SRAM memory unit 84. The NFA engine config command is used to configure the NFA pipeline using values from one of these complete sets of information. The particular complete set of information to be used is determined by the base address set forth in fifth field 167.

FIG. 10 is a diagram of an NFA engine go command 161. The first field 168 of the command indicates that the command is an NFA engine go command. The second field 169 indicates which one of two NFAs is to be started. The third field 170 indicates the first byte of the byte stream 157 that the indicated NFA is to process. The fourth field 171 indicates how may bytes of the byte stream is to be processed. The fifth field 172 indicates the base address of where in SRAM memory unit 84 where the list of results values is to be stored. This base address information is part of the information 152 that is passed from the command interpreter 143 to the output interpreter 151 in FIG. 8. The sixth field 173 is a code that indicates the format that the result values are supposed to have as they are stored in SRAM memory unit 84. The information from this sixth field is another part of the information 152 that is passed from the command interpreter 143 to the output interpreter 151 in FIG. 8. The NFA engine go command is used to start a selected NFA operating.

FIG. 11 is a diagram of an NFA engine event generate command 162. Completion of an NFA does not actually automatically cause an event value to be output from the NFA engine 2 to the event manager 128, but rather a dedicated NFA engine event generate command is supplied to the NFA engine and this dedicated NFA engine event generate command, when executed by the NFA engine, causes the event value to be output from the NFA engine 2. Within the NFA engine it is the output interpreter 151 that outputs the event value. The first field 174 of the NFA engine event generate command indicates that the command is an NFA engine event generate command. The second field 175 indicates that the source of the event is the event ring circuit that inserted the eventual event packet. In this case, the "source of event" is event manager 128 of the SSB peripheral block of the CLS of FIG. 4. The third field 176 indicates that the event is an NFA event. The fourth field 177 is the "reference value" mentioned above. The CPP bus master that originally supplies the NFA engine event generate command to the NFA engine supplies the reference value as part of the NFA engine event generate command. When the reference value is then returned back to the CPP bus master as a result of the NFA engine executing the NFA engine event generate command, and as a result of the autopush described above, the CPP bus master can use the reference value to associate the pushed reference value with the original NFA engine event generate command.

Figure 12A:
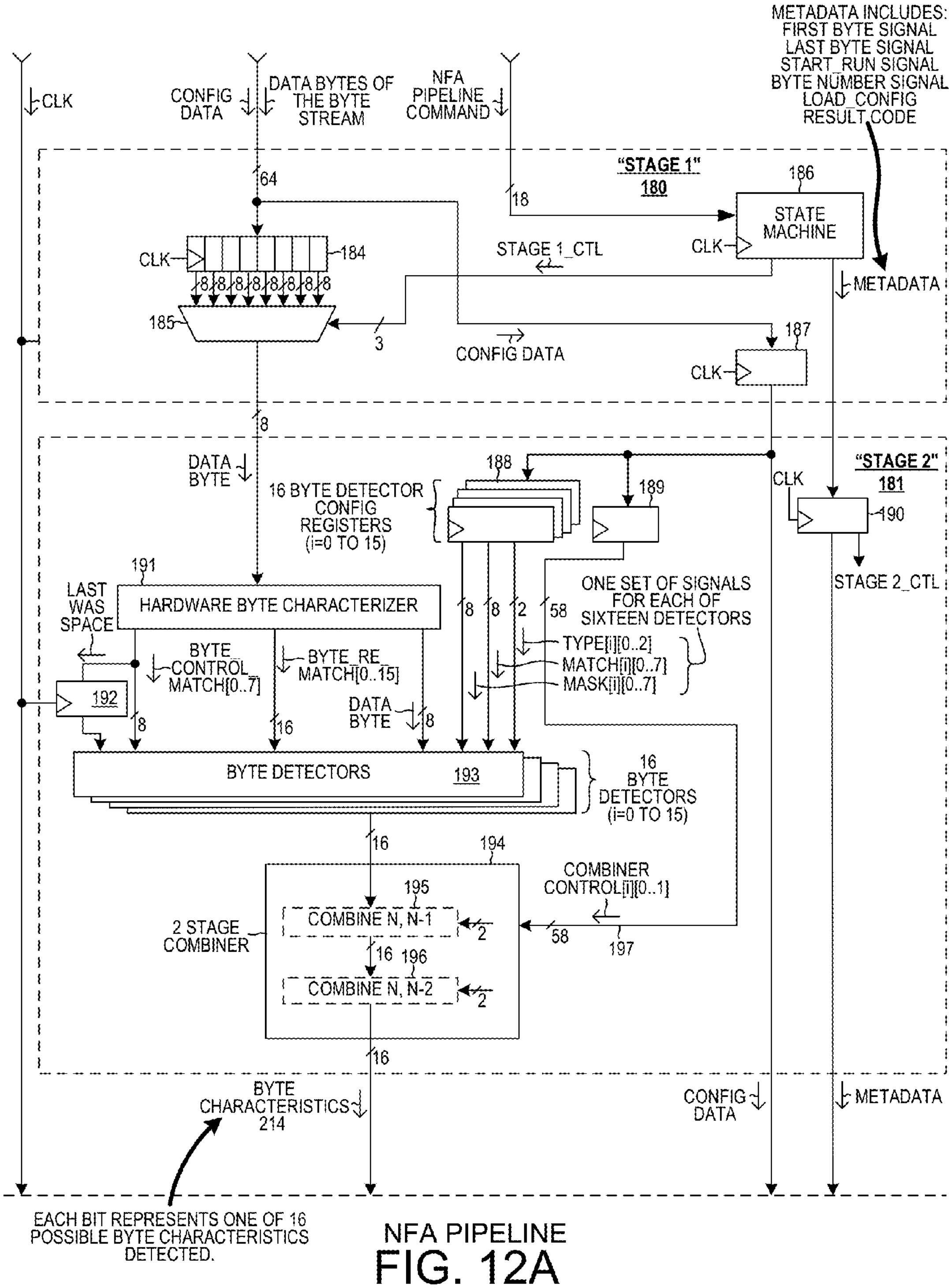
FIG. 12A is a diagram of stage 1 and stage 2 of the NFA pipeline in the NFA engine of FIG. 8.
Figure 12B:
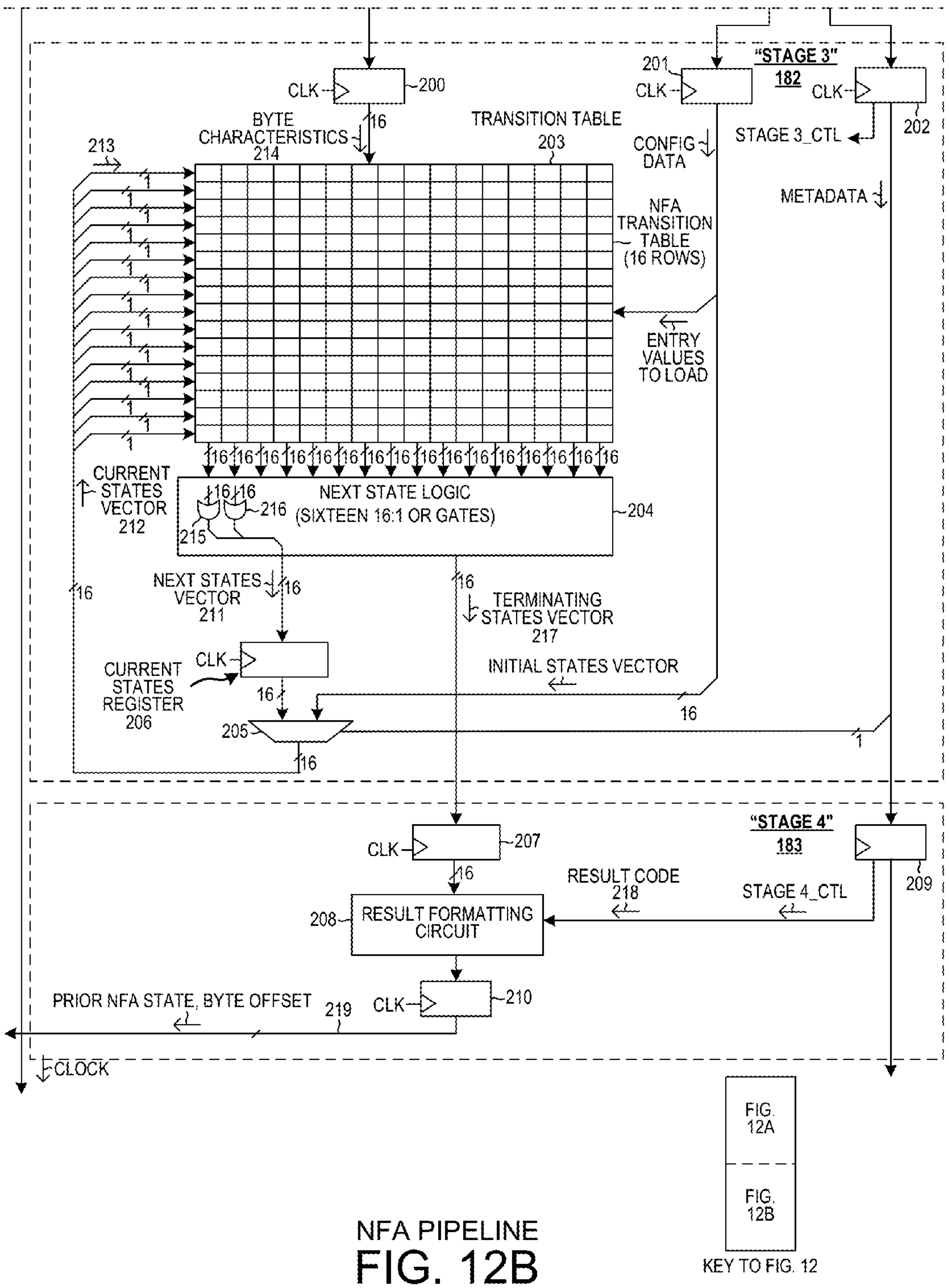
FIG. 12B is a diagram of stage 3 and stage 4 of the NFA pipeline in the NFA engine of FIG. 8.

FIG. 12 is a diagram of the four stages 180, 181, 182 and 183 of the NFA pipeline 140. Stage 1 180 of the NFA pipeline 140 includes a pipeline register 184, a state machine 186, a multiplexer 185, and a second pipeline register 187. Config data and the data bytes of the byte stream are received by stage 1 via conductors from the read FIFO 147. The data bytes of the byte stream are clocked into pipeline register 184 in a first clock cycle. The config data is clocked into pipeline register 187 during the first cycle. The NFA pipeline command is received by state machine 186 during the first cycle. The NFA pipeline command is communicated via conductors to the state machine 186 from FIFO 144. State machine 186 outputs two signals: a select signal to multiplexer 185 and a metadata signal that is communicated to stage 2 181 of the NFA pipeline 140. In response to receiving the select signal from the state machine 186 the multiplexer 185 selects a single data byte (8-bits) from the data bytes of the byte stream and communicates the single selected data byte to the second state of the pipeline during a second cycle. Pipeline register 187 communicates the config data to stage 2 181 during the second cycle. The metadata from the state machine 186 is communicated to stage 2 during the second cycle as well.

Figure 13:
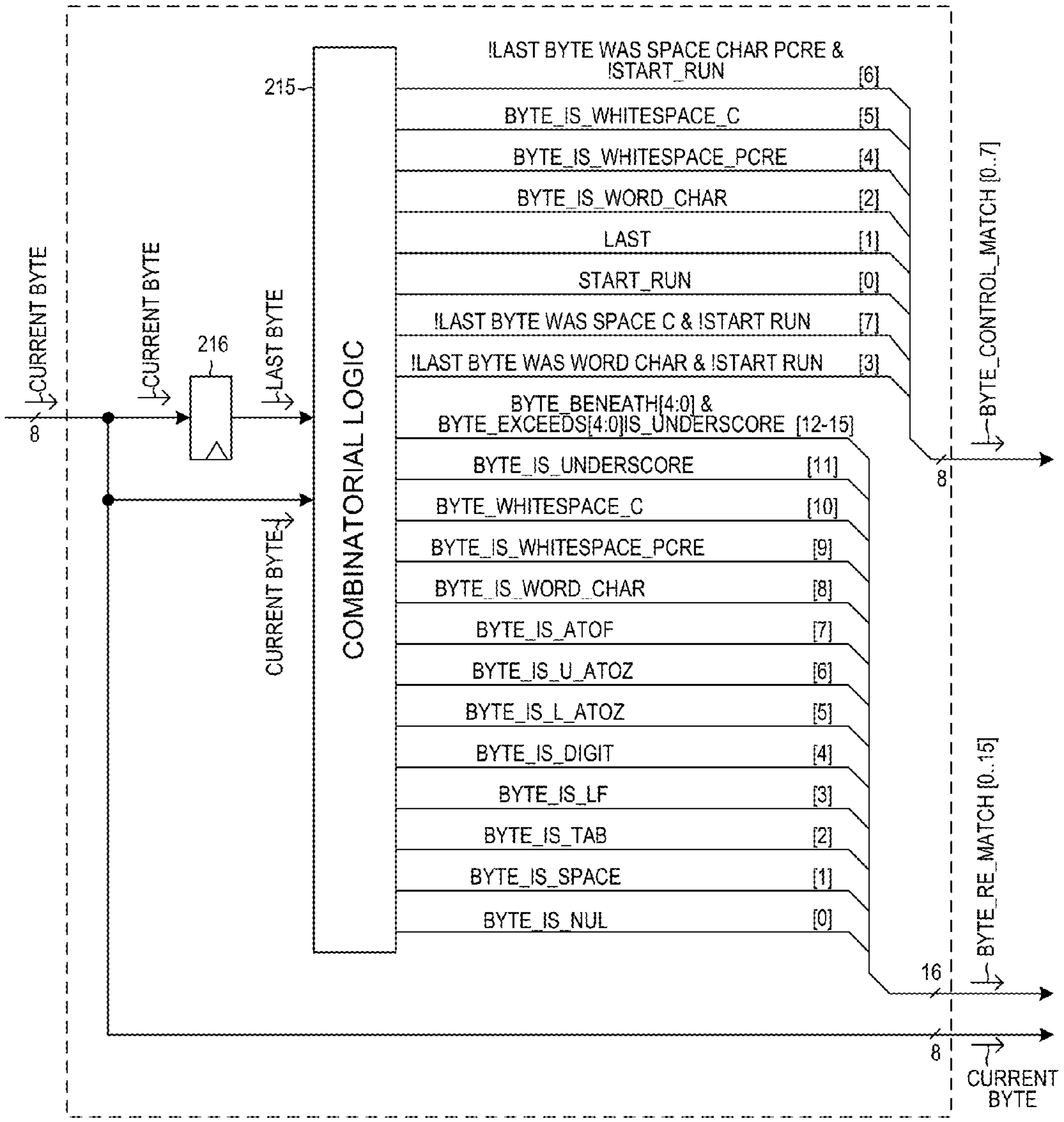
FIG. 13 is a diagram of the hardware byte characterizer in the NFA pipeline of FIG. 12.
Figure 14:
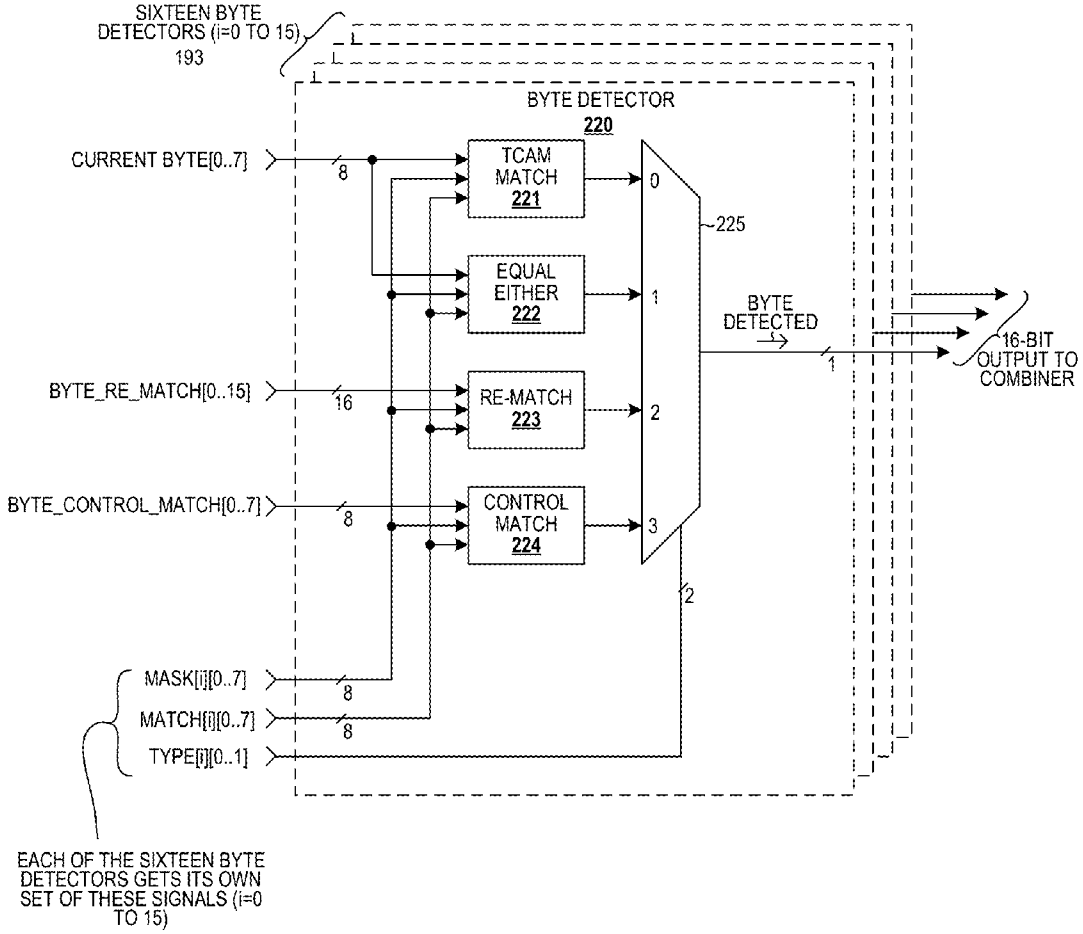
FIG. 14 is a diagram of the byte detectors in the NFA pipeline of FIG. 12.

Stage 2 181 of the NFA pipeline 140 includes sixteen byte detector configuration pipeline registers 188, pipeline registers 189-190, a hardware byte characterizer 191, register 192, sixteen byte detectors 193, and a two-stage combiner 194. Each of the sixteen pipeline registers 188 receives a portion of the config data that was stored in register 187 of stage 1 180 during the previous clock cycle. More particularly, the config data stored in one of the sixteen pipeline registers is configuration data for a corresponding one of the sixteen byte detectors 193. The pipeline register 189 stores another part of the configuration data that was stored in register 187 of stage 1 180 during the previous clock cycle, namely configuration information for the two stage combiner 194. Metadata pertaining to a particular byte is passed down from state machine 186 and is stored in pipeline register 190. This metadata about the byte is available to generate control signals STAGE 2_CTL for the second stage when the second stage is processing that byte. All this configuration and control information configures and controls the other parts of the stage to process the incoming data byte. The incoming data byte is characterized by hardware byte characterizer 191, thereby generating eight BYTE_CONTROL_MATCH[0 . . . 7] values and sixteen BYTE_RE_MATCH[0 . . . 15] values. FIG. 13 is a diagram of the hardware byte characterizer 191. Within hardware byte characterizer 191, the combinatorial logic block 215 contains one combinatorial logic circuit to detect whether the incoming data byte meets a corresponding characteristic. There are sixteen such characteristics to be detected. For example, the single bit signal BYTE_IS_ATOF is asserted if the combinatorial logic 215 detects that the incoming byte is the number of any one of the ASCII codes for characters A to F. Register 216 is provided to allow the combinatorial logic to make a characterization based not only on the current incoming data byte, but also on the previous data byte. The sixteen characterization output bits from the hardware byte characterizer 191 are supplied to each of sixteen byte detectors 193. FIG. 14 is a diagram of the byte detectors 193. Each byte detector receives a set of control signals: MASK[0 . . . 7], MATCH[0 . . . 7] and TYPE[0 . . . 1]. Each byte detector so configured then outputs a single bit output value. There are sixteen byte detectors, so there are sixteen output bits from the byte detectors. An individual byte detector can be configured to detect whether an incoming byte is a particular value, or has particular characteristics. For example, if the TYPE[0 . . . 1] bits for the first byte detector 220 are set to select a TCAM match operation, then the current data byte undergoes a TCAM match operation. The data byte actually passes straight through the hardware byte characterizer 191 so that the data byte is also available to the byte detectors 193. If the data byte is deemed to match, then the byte detected output bit for the first byte detector 220 is asserted. The sixteen output bits of the byte detectors 193 are supplied to the two-stage combiner 194. The two-stage combiner 194 is configured by fifty-eight control signals received on control conductors 197. FIG. 19 is a diagram of the two-stage combiner 194 of FIG. 12. Reference numeral 195 identifies the first stage of the combiner, and reference numeral 196 identifies the second stage of the combiner. FIG. 20 is a detailed diagram of one of the combiner cells 265 of the two-stage combiner 194 of FIG. 19. FIG. 21 is a truth table that sets forth the function performed by the combiner cell 265 of FIG. 20. The sixteen output bits of the two-stage combiner 194 are output from stage 2 181.

Stage 3 182 includes pipeline registers 200-202, transition table 203, next state logic 204, a multiplexer 205, and a current states register 206. Transition table 203 is a two-dimensional array of 4-bit storage locations, where each storage location can store a 4-bit "entry value". The table is "two-dimensional" not necessarily in a spatial sense, but rather is two-dimensional in a logical sense. An entry value indicates one of sixteen states. There are sixteen rows of sixteen such entry values, where each row corresponds to a state. The top row corresponds to state "0000", the next row down corresponds to state "0001", and so forth. One or more of the rows can be "active". A row is indicated to be "active" if its corresponding bit in a "current state vector" 212 is asserted. For example, if the bit 213 of the "current states vector" 212 is asserted, then the top row is active. Within a row, an entry value is "selected" if the row is active and if the entry value is in a column of a byte characteristic bit that is asserted. The sixteen byte characteristic bits 214 are shown coming down from the top of the transition table in the illustration of FIG. 12.

The next state logic 204 includes sixteen 16:1 OR gates. Each row of the transition table supplies one bit to each OR gate. For example, the top row supplies the leftmost bit coming into OR gate 215, and supplies the leftmost bit coming into OR gate 216, and so forth. The second row from the top supplies the next leftmost bit coming into OR gate 215, and supplies the next leftmost bit coming into OR gate 216, and so forth. If any of the selected entry values in the top row is "0000", then the leftmost bit coming into the leftmost OR gate 215 is set. If any of the selected entry values in the top row is "0001", then the leftmost bit coming into the next leftmost OR gate 216 is set. If any of the sixteen bits supplied from the transition table into OR gate 215 is asserted, then OR gate 215 asserts the leftmost bit of the "next states vector" 211. The leftmost bit of the "next states vector" 211 being set indicates that one or more selected entry values in the transition table are pointing to a next state of "0000". Similarly, the next leftmost bit of the "next states vector" 211 being set indicates that one or more selected entry values in the transition table are pointing to a next state of "0001". The bits of the "next state vector" 211 indicate which of the sixteen states will be active in the next cycle of the NFA. The current states register 206 outputs the "current states vector" 212 to the transition table, and receives the "next state vector" 211 from the transition table. At the beginning of NFA operation, the active states are not determined by the transition table 203, but rather are part of the configuration data stored in pipeline register 201. This initial states vector is supplied from the pipeline register 201 via multiplexer 205 to be the current states vector 212. An NFA can start in multiple states, so more than one bit of the initial states vector can be set. The 4-bit transition table entry values can be preloaded into the 4-bit storage locations of the transition table 203 under the control of the command interpreter 143 as a result of executing an NFA engine config command whose subtype field indicates that transition table entry values are to be configured.

Stage 4 183 includes pipeline registers 207 and 209, a result formatting circuit 208, and an output register 210. In one example, state "1110" (14) is the result state. When the transition table indicates a transition to state "1110", then the previous current active state that gave rise to the transition is communicated as part of a "terminating states vector" 217 into pipeline register 207. Each bit of the 16-bit "terminating states vector" 217 corresponds to a prior state that could have given rise to the transition to the result state. If the bit is set, then the corresponding state is indicated to have given rise to a transition to the result state. The result code 218 as passed to the pipeline register 209 of stage 4 183 indicates the format that the prior state information will be output in. As determined by the result code 218, a result value is typically formatted to include: 1) a 4-bit value that indicates the prior state that gave rise to the transition to the result state, and 2) a 12-bit byte offset from the start of the byte processed by the NFA, where the offset identifies the data byte in the byte stream that caused the transition. The two values are a pair and relate to the same transition to the result state. In an NFA, multiple terminations can occur in the same clock cycle, so multiple corresponding 16-bit result values can be generated during one clock signal as well. The 16-bit result values are stored in output register 210, and are then output from the NFA pipeline 140 via conductors 219 so that they can be stored as a list in SRAM memory unit 84. The end of a list of such 16-bit result values as stored in the SRAM memory unit 84 is marked by a stored 16-bit value of "FFFF".

Figure 15:
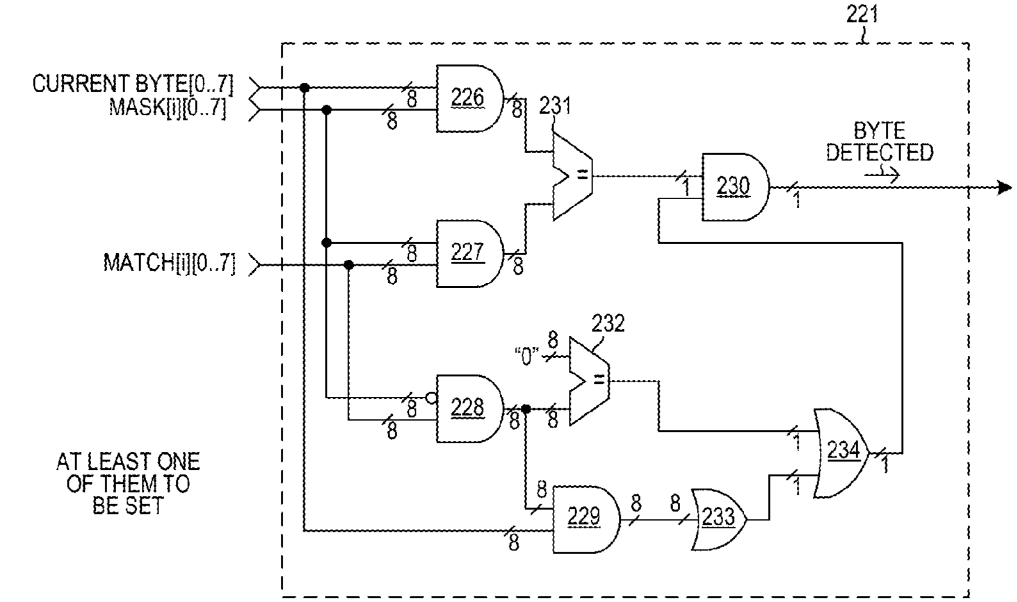
FIG. 15 is a diagram of the TCAM match matching circuit in one of the byte detectors of FIG. 14.
Figure 16:
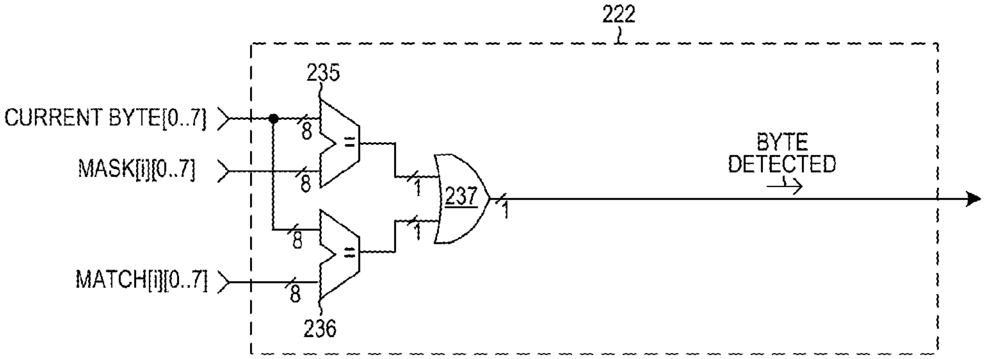
FIG. 16 is a diagram of the equal either matching circuit in one of the byte detectors of FIG. 14.
Figure 17:
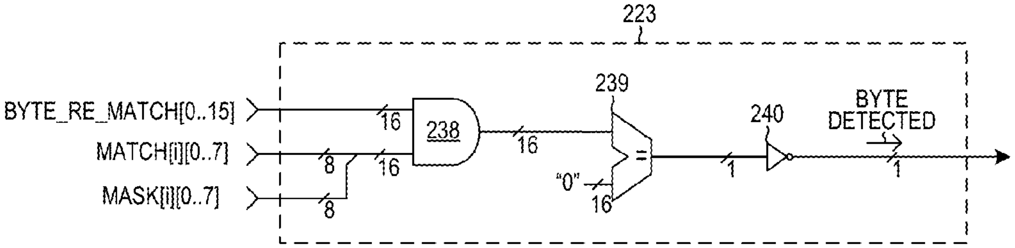
FIG. 17 is a diagram of the re-match matching circuit in one of the byte detectors of FIG. 14.
Figure 18:
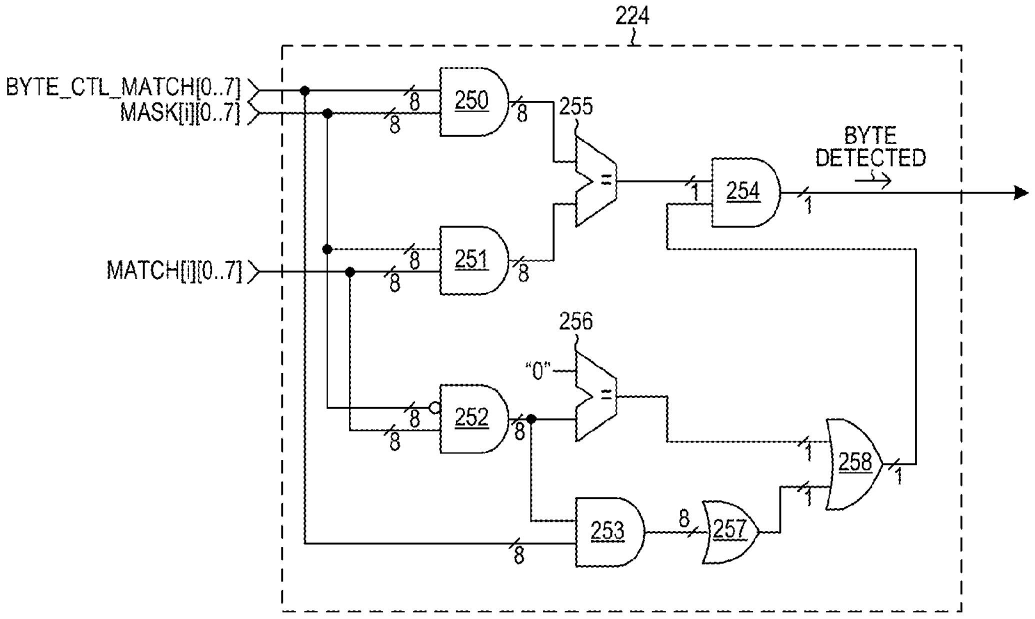
FIG. 18 is a diagram of the control match matching circuit in one of the byte detectors of FIG. 14.

The composition and operation of a byte detector of stage 2 181 is described in further detail in connection with FIG. 14. Byte detector 220 includes the TCAM match circuit 221, an equal either circuit 222, a re-match circuit 223, a control match circuit 224, and an output multiplexer 225. FIG. 15 is a more detailed diagram of the TCAM match circuit 221. FIG. 16 is a more detailed diagram of the equal either circuit 222. FIG. 17 is a more detailed diagram of the re-match circuit 223. FIG. 18 is a more detailed diagram of the control match circuit 224. The two-bit TYPE[0 . . . 1] configuration value determines which one of the circuits 221-224 will be selected to provide the "BYTE DETECTED" output bit of the byte detector 220.

The TCAM match circuit 221 of FIG. 15 is not a TCAM memory circuit and does not involve memory cells, but rather is a combinatorial logic circuit that performs a TCAM operation. The output "BYTE DETECTED" bit is asserted if each of the eight bits of the incoming current byte is determined to match a corresponding one of the eight bits of the match value, where individual ones of the bits can be selected to match (i.e., are masked) regardless of the values of the byte and match bits by virtue of a corresponding bit in the MASK[0 . . . 7] being cleared (i.e., "0"). The mask bits indicate which bit or bits to exclude from the bit-wise compare operation. If the corresponding mask bit is set (i.e., "1"), then no masking occurs and all data bits must match their corresponding match bits. Each of the symbols 226-229 represents eight 2:1 AND gates. Symbol 230 represents a 2:1 AND gate. Each of symbols 231 and 232 represents a comparator that compares two 8-bit values. Symbol 233 represents a single 8:1 OR gate, and symbol 234 represents a 2:1 OR gate. In a typical memory-based TCAM, if the mask bit is cleared to perform masking then the value of the corresponding match bit does not matter, and regardless of the value of the match bit the data bit will be deemed to match the match bit. In the circuit of FIG. 15, setting the mask bit to be "0" and setting the match bit to be "0" results in an ordinary mask bit function. But in the circuit of FIG. 15, setting the mask bit to be "0" and setting the match bit to a "1" causes the overall TCAM match circuit 221 to require at least one of the associated data bits to be set in order for the output "BYTE DETECTED" to be asserted.

The equal either circuit 222 of FIG. 16 asserts the output "BYTE DETECTED" signal if the current incoming data byte matches either the 8-bit value on the MASK[0 . . . 7] inputs or the 8-bit value on the MATCH[0 . . . 7] inputs. Each of symbols 235 and 236 represents a comparator that compares two 8-bit values. Symbol 237 represents a 2:1 OR gate.

The re-match circuit 223 of FIG. 17 asserts the output "BYTE DETECTED" signal if any of the unmasked bits of the 16-bit BYTE_RE_MATCH[0 . . . 15] is set (i.e., "1"). The MATCH[0 . . . 7] and MASK[0 . . . 7] together effectively form a 16-bit mask value, where a cleared bit (i.e., "0") indicates that the corresponding data bit of BYTE_RE_MATCH[0 . . . 15] is to be masked. Symbol 238 represents sixteen 2:1 AND gates. Symbol 239 represents a comparator that compares two 16-bit values. The signal output by comparator 239 is inverted by inverter 240 to generate the output "BYTE DETECTED" signal. In another example, inverter 240 is not included.

The control match circuit 224 of FIG. 18 performs the same TCAM operation as the TCAM match circuit of FIG. 15, except that the control match circuit 224 compares the 8-bit incoming BYTE_CTL_MATCH[0 . . . 7] value to the unmasked match bits in contrast to the circuit of FIG. 15 that compares the 8-bit incoming data byte value CURRENT_BYTE[0 . . . 7] to the unmasked match bits. Each of the symbols 250-253 represents eight 2:1 AND gates. Symbol 254 represents a 2:1 AND gate. Each of symbols 255 and 256 represents a comparator that compares two 8-bit values. Symbol 257 represents a single 8:1 OR gate, and symbol 258 represents a 2:1 OR gate.

Figure 22A:
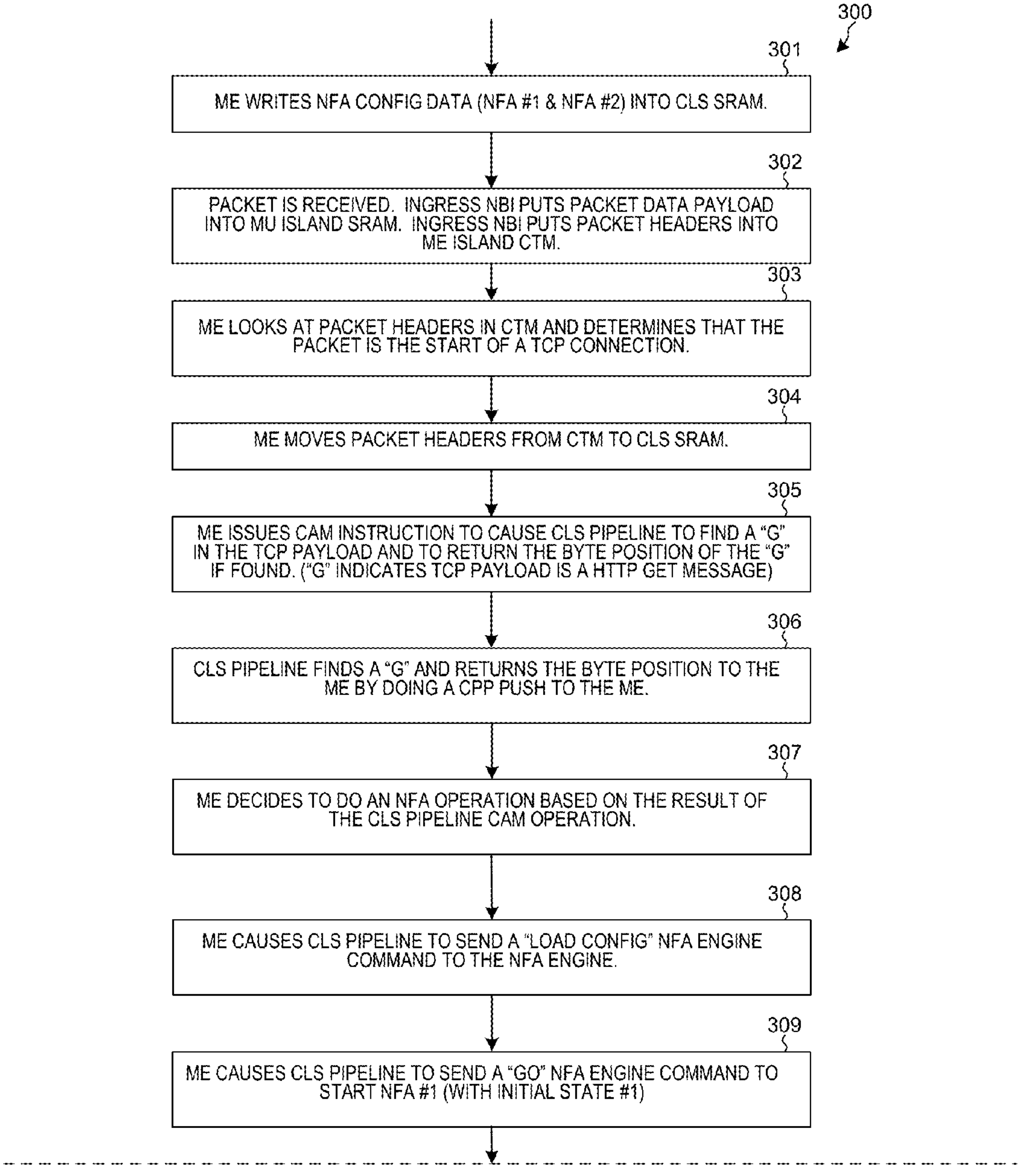
FIG. 22A is a flowchart showing steps 301-309 of a method in accordance with one novel aspect.
Figure 22B:
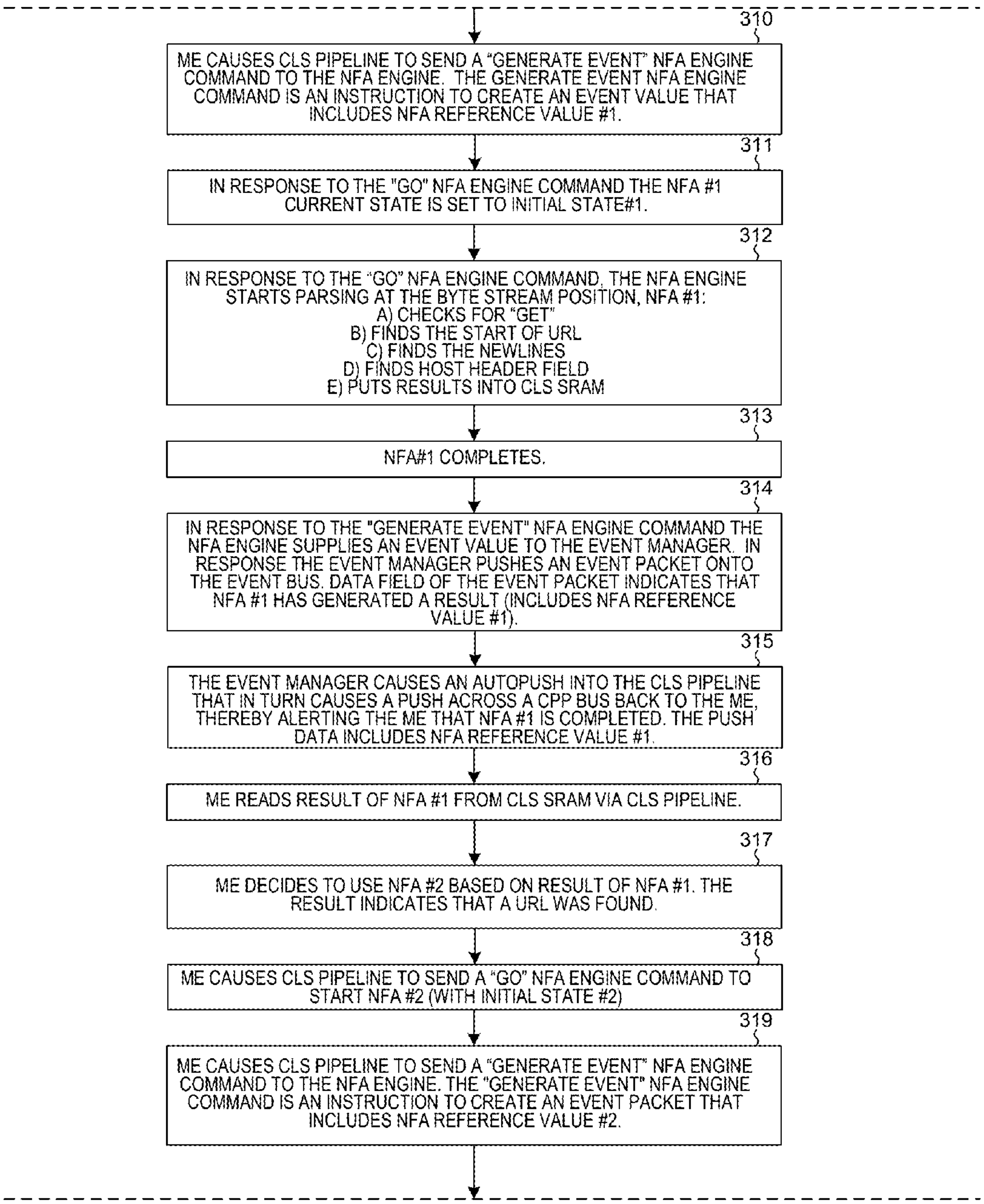
FIG. 22B is a flowchart showing steps 310-319 of a method in accordance with one novel aspect.
Figure 22C:
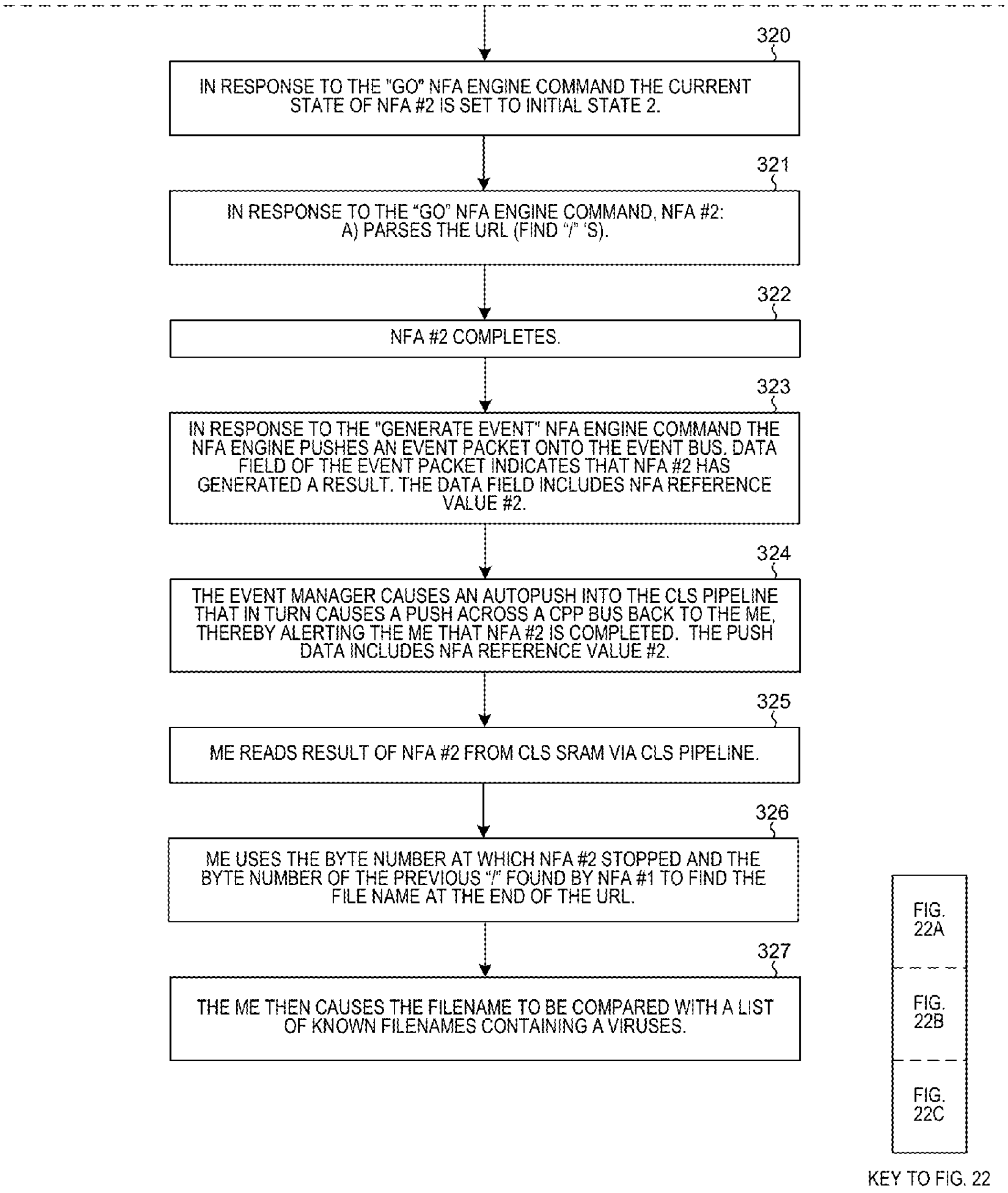
FIG. 22C is a flowchart showing steps 320-327 of a method in accordance with one novel aspect.

FIG. 22 is a flowchart of a method 300 involving two automatons encoded in a single NFA transition table in accordance with one novel aspect. In step 301, microengine (ME) 71 writes NFA config data 360 for two NFA operations (NFA#1 and NFA#1) into SRAM memory unit 84.

Figure 23:
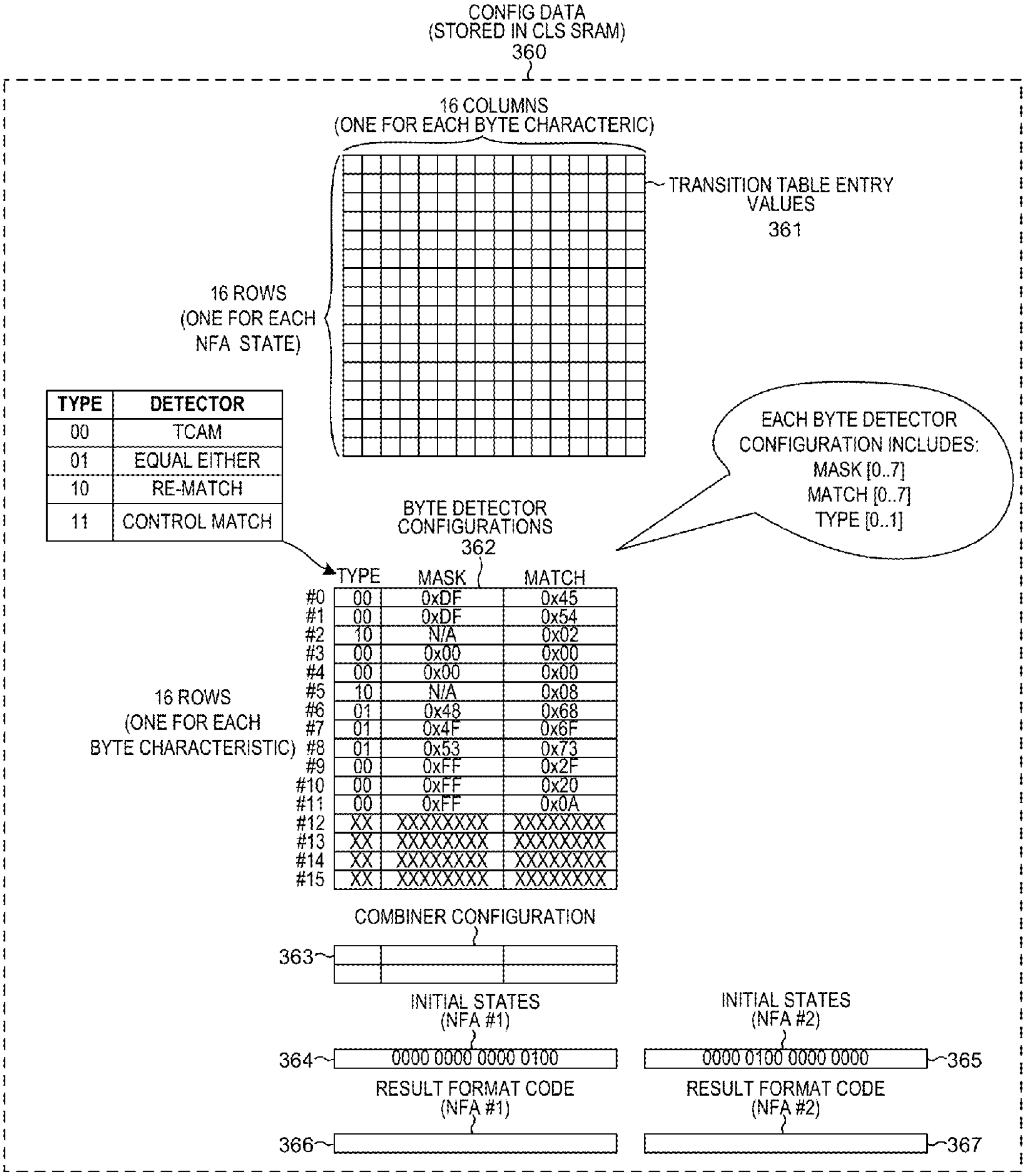
FIG. 23 is a diagram that illustrates the configuration data (to configure the NFA pipeline) stored in the SRAM memory unit of the CLS of FIG. 4.

FIG. 23 is a diagram of the config data 360. Config data 360 is stored in the CLS SRAM memory unit 84 and is used to configure the NFA pipeline so that the pipeline implements NFA#1 and NFA#2. The config data 360 in SRAM memory unit 84 includes the transition table entry values 361, byte detector configurations 362, combiner configurations 363, NFA#1 initial states 364, NFA#2 initial states 365, NFA#1 result format code 366, and NFA#2 result format code 367. Each byte detector configuration 362 includes a type field, a mask field, and a match field. The type field includes two bits for each byte characteristic, where "00" indicates use of a TCAM detector, "01" indicates use of an equal either detector, "10" indicates use of a re-match detector, and where "11" indicates use of a control match detector.

Figure 24:
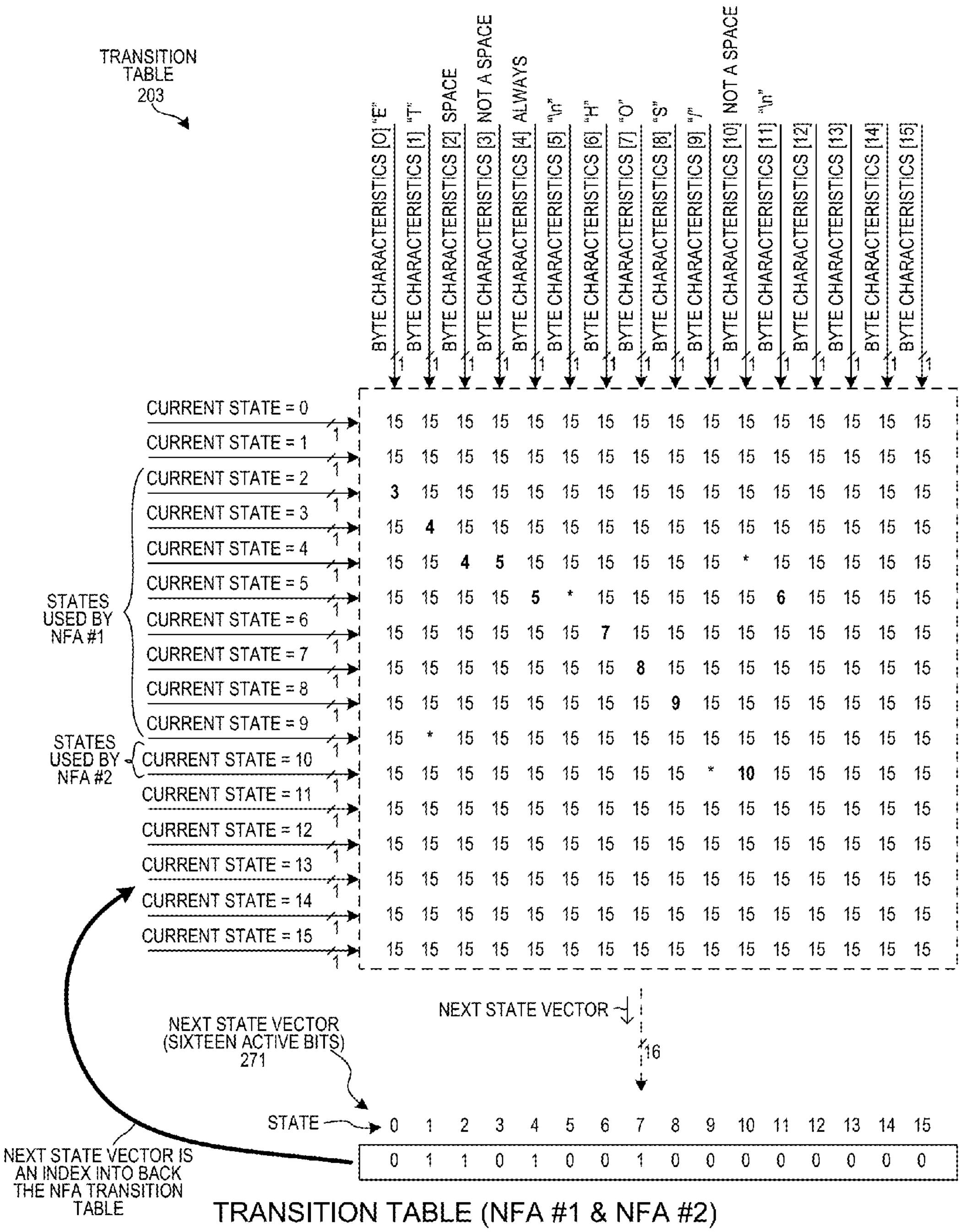
FIG. 24 is a diagram that shows a set of transition table entry values that encode two NFAs (NFA#1 and NFA#2) in the same transition table.

FIG. 24 is a diagram showing the transition table entry values 361 of FIG. 23 in more detail. NFA transition table 203 includes entry values that encode both a first NFA (NFA#1) and a second NFA (NFA#2). The entry values for NFA#1 are encoded into current state rows 2-9 of the transition table. The entry values for NFA#2 are encoded into current state row 10 of the transition table. The transition table is utilized to determine a next state vector based on: 1) the active current state(s), and 2) the satisfied byte characteristics. An entry value located at the intersection of an active current state and the satisfied byte characteristics indicates a next state. All such indicated next states are logically combined to generate a 16-bit next state vector which serves as an index of current states back into the transition table when analyzing the next byte in the incoming byte stream. State 14 is the result state. State 15 is the terminate state. If the next state is state 14 (i.e., the result state), then the transition table outputs the current state (the current state that gave rise to the transition to the result state) as an output of the transition table. This output is used to generate the result value. A transition into state 15 does not result in a result value being generated, and all entry values in the terminate state point back to the terminate state.

Figure 25:
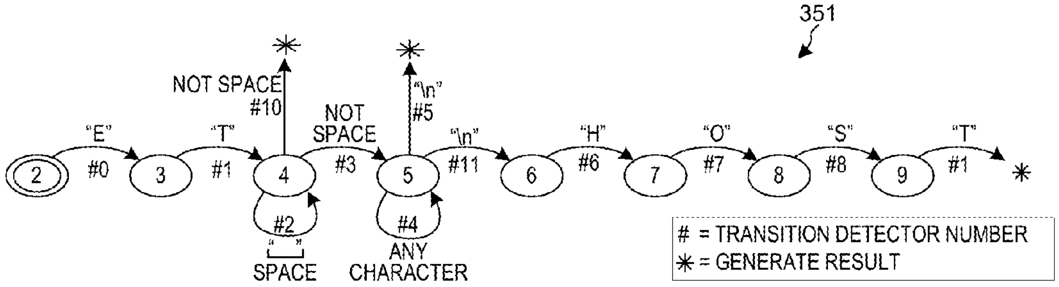
FIG. 25 is a graph of the first NFA, NFA#1.

FIG. 25 is a graph of NFA#1 351.

Figure 26:
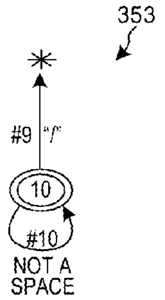
FIG. 26 is a graph of the second NFA, NFA#2.

FIG. 26 is a graph of NFA#2 353.

In step 302 of the method of FIG. 22, a packet 340 (e.g., an ethernet frame) is received by the IB-NPF integrated circuit 13.

Figure 27:
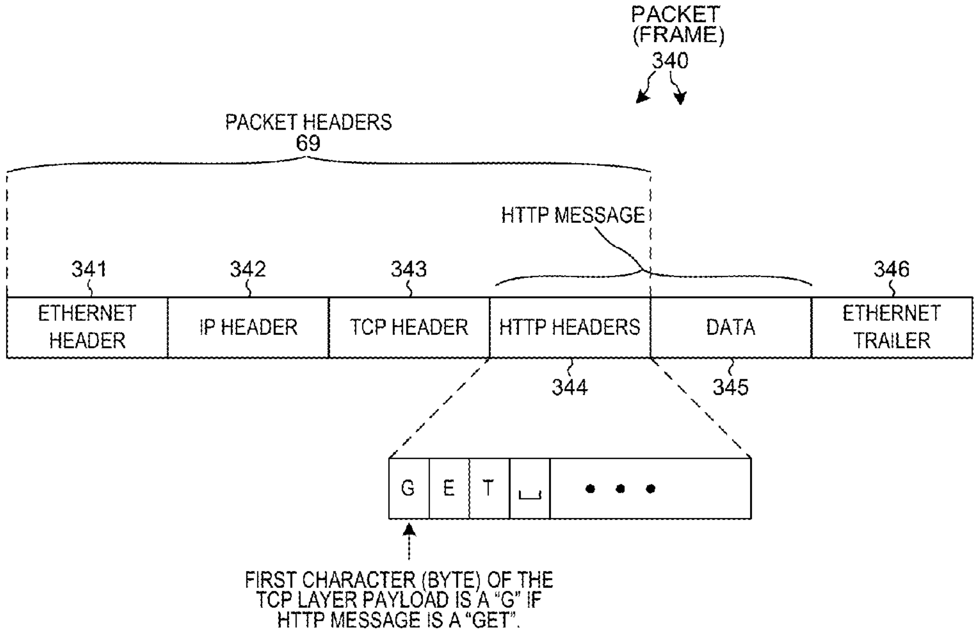
FIG. 27 is a diagram of a packet that is analyzed using the novel NFA engine of FIG. 4 in accordance with one novel aspect.

FIG. 27 is a diagram of the packet 340. The packet 340 (i.e. ethernet frame) contains an HTTP GET message. The packet 340 includes an ethernet header 341, an Internet Protocol (IP) header 342, a TCP header 342, HTTP headers 344, a data field 345, and an ethernet trailer 346. The HTTP GET message includes the HTTP headers 344 and the data field 345.

Ingress island 58 in the IB-NFP writes the packet data payload into SRAM in Memory Unit (MU) island 64. Ingress island 58 also writes the packet headers 69 into Cluster Target Memory (CTM) 66 in ME island 52. In addition the packet headers 69 are copied to the ME 71. In step 303, ME 71 determines that the received packet is the start of a Transmission Control Protocol (TCP) connection based on the packet headers. In step 304, ME 71 then moves the packet headers 69 from CTM 66 to the CLS memory unit SRAM 84. In step 305, the ME 71 issues a Content Addressable Memory (CAM) instruction to cause the CLS pipeline 92 to find the "G" in the TCP payload and to return the byte position of the "G" in the event that a "G" is found in the TCP payload. Searching for the "G" in the TCP payload aids in the determination of whether the TCP payload includes a HTTP "GET" message.

Figure 28:
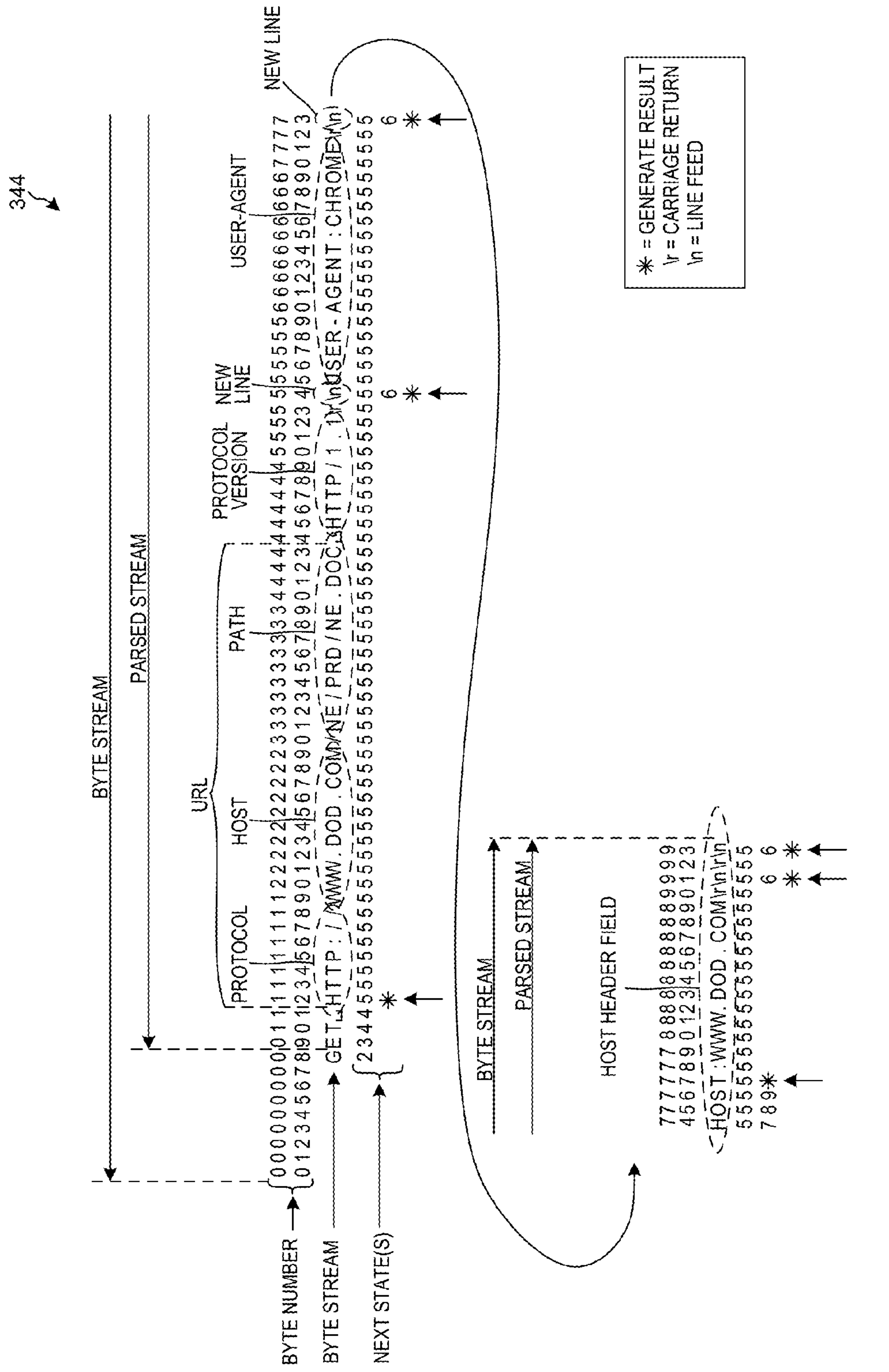
FIG. 28 is a diagram that illustrates how NFA#1 analyzes a byte stream (taken from the packet of FIG. 27) in accordance with one novel aspect.

FIG. 28 is a more detailed diagram of the HTTP headers 344 of FIG. 23.

In step 306 of the method of FIG. 22, the CLS pipeline finds a "G" in the TCP payload and returns the byte position to the ME 71 by performing a Command-Push-Pull (CPP) push. In step 307, the ME decides to do an NFA operation based on the result of the CLS pipeline CAM operation (when the CAM operation finds a "G"). In step 308, the ME causes the CLS pipeline to send a NFA engine "LOAD CONFIG" command to the NFA engine. The NFA engine executes the load config NFA engine command, thereby loading the config data 360 of FIG. 23 into the NFA pipeline 140. In step 309, the ME causes the CLS pipeline to send a NFA engine "GO" command to start NFA#1 at a selected initial state#1. In step 310, the ME then causes the CLS pipeline to send a NFA engine "GENERATE EVENT" command to the NFA engine. The NFA engine "GENERATE EVENT" command is an instruction the NFA engine to output an event value to the event manager. The event value includes an NFA reference value #1 400. In step 311, as a result of the NFA engine carrying out the NFA engine "GO" command, the NFA#1 current state is set to initial state#1. In step 312, as a result of the NFA engine carrying out the NFA engine "GO" command, the NFA engine starts parsing at the byte stream position using NFA#1. The byte stream 344 illustrated in FIG. 28 is parsed according to the graph of NFA#1 351 shown in FIG. 25. The NFA engine implements NFA#1 as a result of loading the entry values shown in transition table 203 (current states 2-9). The parsed portion of the byte stream ("parsed stream") is illustrated in FIG. 28. The NFA engine performing NFA#1 performs the following steps: a) finds the "GET"; b) finds the start of the Uniform Resource Locator (URL); c) finds the newlines ("\n"); d) finds the host header field; and e) puts result values into the SRAM memory unit 84. The URL (including PROTOCOL, HOST, and PATH fields), protocol version field, newline fields, user-agent field, and host header field are illustrated in FIG. 28. A transition to the result state is indicated on FIG. 28 by a vertical arrow pointing to an asterisk.

NFA#1 generates a first result value when "E" followed by "T" followed by "space" followed by a "not space" sequence is found. The first result includes the number of the state from which the transition to the result state occurred. As indicated by the graph of FIG. 25, this state is state 4. The result value also includes the byte offset from the beginning of the parsed stream, which is an offset of 3 bytes. Once in state 4, an incoming byte that is a "not space" causes a state transition to state 5.

NFA#1 next generates a second result value when NFA#1 finds a newline after the protocol version field of the parsed stream. The second result value includes the number of the state from which the transition to the result state occurred. As indicated by the graph of FIG. 25, this state is state 5. The byte offset into the parsed stream when this occurs is an offset of 45 bytes.

The third result value is generated when NFA#1 finds the second newline after the user-agent field of the parsed stream. The third result value includes the number of the state from which the transition to the result state occurred. As indicated by the graph of FIG. 25, this state is state 5. This occurs at a byte offset of 64 bytes.

The fourth result value is generated when NFA#1 finds an "H" followed by an "O" followed by an "S" followed by a "T". The fourth result value includes the number of the state from which the transition to the result state occurred. As indicated by the graph of FIG. 25, this state is state 9. This occurs at a byte offset of 68 bytes.

The fifth result value is generated when NFA#1 finds the third newline in the parsed stream. The fifth result value includes the number of the state from which the transition to the result state occurred. As indicated by the graph of FIG. 25, this state is state 5. This occurs at a byte offset of 82 bytes.

The sixth result value is generated when NFA#1 finds the fourth newline in the parsed stream. The sixth result value includes state number 5, and a byte offset of 84 bytes. Next, in step 313 of the method of FIG. 22, NFA#1 completes.

FIG. 29 is a diagram that shows the list of the result values generated as a result of NFA#1. Each result value includes: 1) four bits indicating the state from which the result was generated; and 2) twelve bits of byte offset that indicate the offset position from the beginning of the parsed stream. In the present example, a byte offset value of "FF" indicates that the prior result value is the last result value in the list.

In step 314, in response to the NFA engine "GENERATE EVENT" command, the NFA engine 2 supplies an event value to the event manager 128. The event manager 128 in turn pushes an event packet on the event bus (EB).

FIG. 30 is a diagram showing the bit sequence of an event packet 370. Event packet 370 includes a vacancy indicator field 371, a source of event field 372, a type of event field 373, and event data field 374.

FIG. 31 sets forth a description of each field of the event packet of FIG. 30. The data field 374 of the event packet contains the reference value (reference value #1) supplied by the ME, where the reference value indicates that NFA#1 has completed. In step 315, the event manager 128 causes autopush into the CLS pipeline 92. The auto push into the CLS pipeline 92 in turn causes a push across the CPP bus back to the ME 71, thereby alerting the ME that NFA#1 has completed. The ME 71 may, for example, be alerted by a write into a predetermined memory location in memory 83, where the autopush cases the reference value to be written into the predetermined memory location. Alternately, ME 71 may poll the predetermined memory location to learn of the event. The data payload of the push contains the reference value (reference value #1).

FIG. 32 is a listing and description of fields included in the data payload for the CPP bus push. In step 316, the ME uses the CLS pipeline to read the result values of NFA#1 from CLS SRAM memory unit 84 via the CLS pipeline. In step 317, the ME then decides to use NFA#2 based on the NFA#1 result values. In the present example, the NFA#1 result values indicate that a URL was found. In step 318, the ME causes the CLS pipeline to send a NFA engine "GO" command to start NFA#2 at an initial state#2. In step 319, the ME causes the CLS pipeline to send a NFA engine "GENERATE EVENT" command to the NFA engine. The NFA engine "GENERATE EVENT" command is an instruction to create an event value that includes another reference value 401 (NFA reference value #2 401). In step 320, in response to the NFA engine "GO" command, the current state of NFA#2 is set to initial state#2. In step 321, NFA#2 parses the URL in response to the NFA engine "GO" command. NFA#2 finds all "/"s included in the URL and generates a corresponding list of NFA result values for NFA#2.

Figure 33:
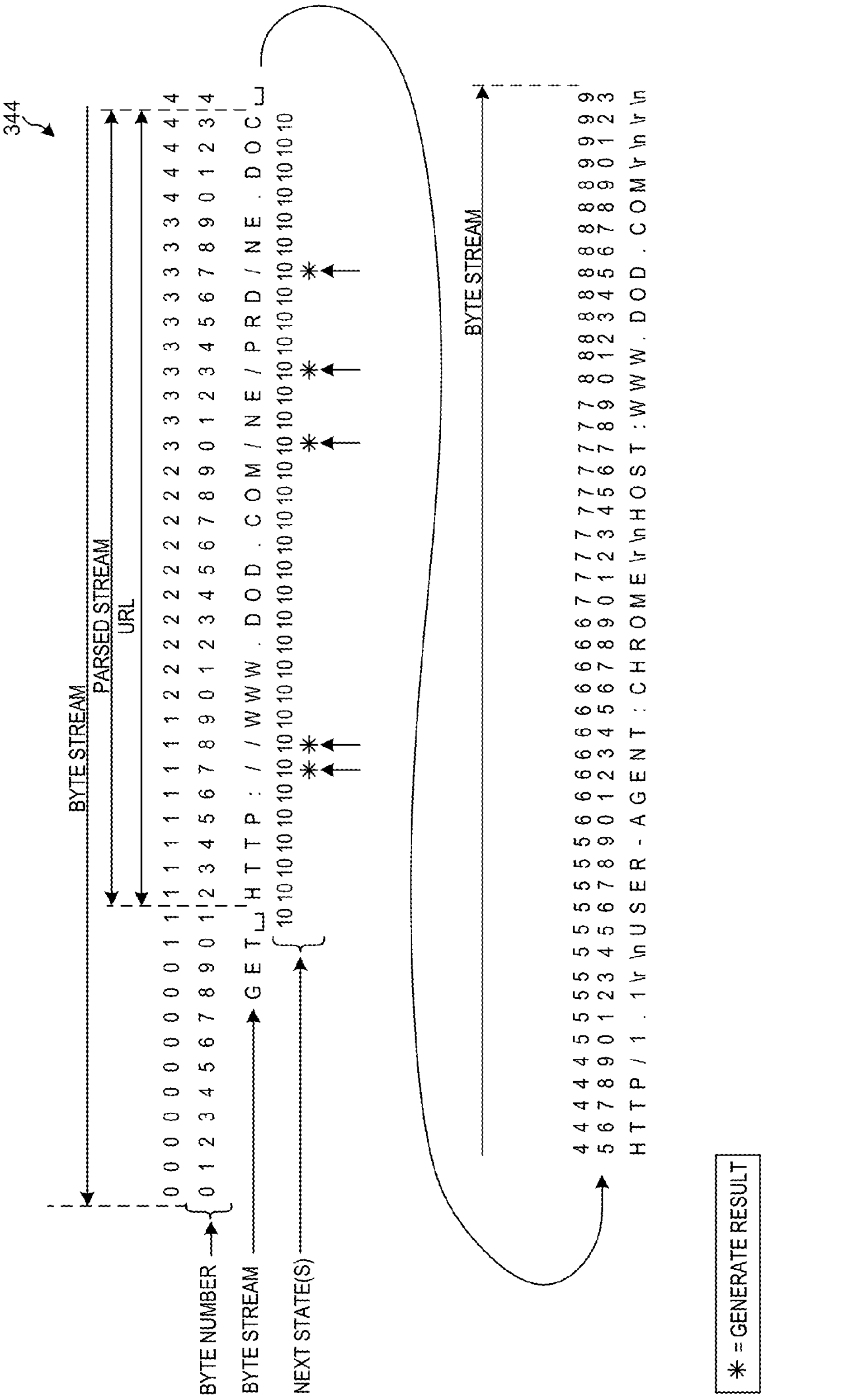
FIG. 33 is a diagram that illustrates how NFA#2 analyzes a byte stream (taken from the packet of FIG. 27) in accordance with one novel aspect.

FIG. 33 is a diagram of the byte stream 344 as processed by NFA#2. The parsed portion of the byte stream ("parsed stream") is illustrated in FIG. 33. A vertical arrow pointing to an asterisk indicates a transition to the result state. A transition to the result state causes a result value to be generated. The graph of NFA#2 shown in FIG. 26 illustrates that NFA#2 only generates a result value when a "/" is found in the parsed stream. Referring back to FIG. 33, a result value is generated for each "/" found (five in total) by NFA#2 before reaching the first space at the end of the URL. NFA#2 remains in state 10 until the end of the URL has been parsed. As mentioned above, the end of the URL is determined using the results of NFA#1.

FIG. 34 is a diagram showing the five result values generated by NFA#2. Each result value includes: 1) four bits indicating the state from which the result was generated, and 2) twelve bits of byte offset that indicate the offset position from the beginning of the parsed stream. The parsed stream in this case is the bytes of the URL. In the list of FIG. 34, a byte offset value of "FF" indicates that the prior listing is the last result value. The byte offsets of the "/"s are used by the ME to parse the filename of the URL.

NFA#2 then completes in step 322. In step 323, as a result of carrying out of the NFA engine "GENERATE EVENT" command, the NFA engine 2 supplies an event value to the event manager 128. The event manager 128 pushes an event packet onto the event bus EB. The data field of the event packet includes the second NFA reference value (NFA reference value #2) 401. NFA reference value #2 indicates that NFA#2 has completed. The event manager 128 then detects the event packet on the event bus, and in response causes an auto push into the CLS pipeline (step 324). The autopush in turn causes the CLS pipeline to do a CPP bus push across the CPP bus back to the ME. The push data includes NFA reference value #2 and this is used by the ME 95 an indication that NFA#2 has completed. In step 325, the ME reads the result values of NFA#2 (see FIG. 34) from SRAM memory unit 84 via the CLS pipeline. In step 326, the ME uses the byte number at which the NFA#2 stopped and the byte number of the previous "/" found by NFA#1 to find the filename at the end of the URL. The ME then causes the filename to be compared with a list of filenames of files known to contain viruses. In one example, all filenames that are found to match one of the listed filenames are deleted and not communicated by the IB-NFP integrated circuit 13.

Figure 35:
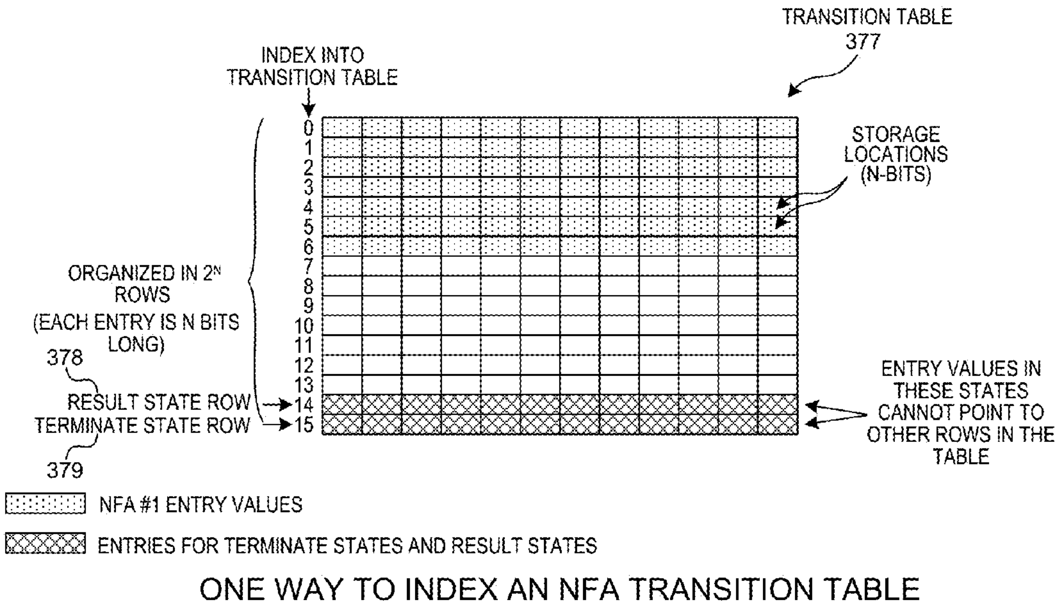
FIG. 35 is a diagram that illustrates one way to index an NFA transition table.

FIG. 35 illustrates an example of a single NFA encoded in a transition table 377 such that entry values stored in two rows 378 and 379 of the table cannot point to other rows in the table. Index 15 points to the bottom row of transition table 377. The bottom row is the terminate state row. Index 14 points to the next most bottom row of transition table 377. The next most bottom row is the result state row. The NFA engine outputs a result value when the next state vector points to the result state row. Similarly, a transition into the terminate state 15 cannot result in a further transition because all entry values in the row of state 15 contain entry values pointing back to state 15. Therefore, entry values stored in the result state row and in the terminate state row are not used by the NFA. Accordingly, only fourteen rows can store entry values that point to another row in the transition table.

Figure 36:
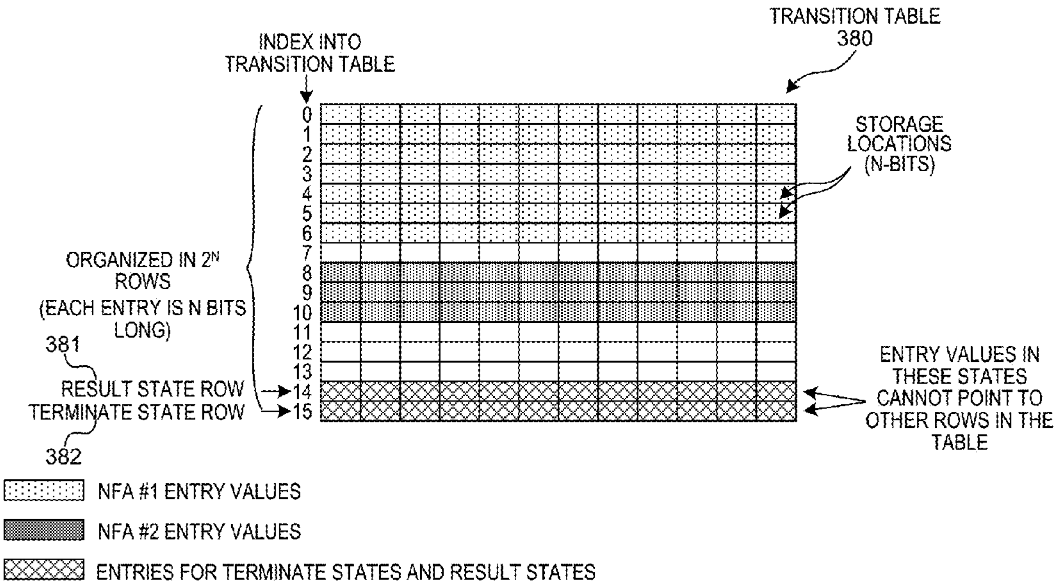
FIG. 36 is a diagram that illustrates another way to index an NFA transition table.

FIG. 36 illustrates an example of two NFAs encoded in a transition table 380 such that entry values stored in two rows 381 and 382 of the table cannot point to other rows in the table. Transition table 380 shown in FIG. 36 is similar to transition table 377 shown in FIG. 35 in that both NFA#1 and NFA#2 use the same result state row and the same terminate state row. Therefore, only fourteen of the sixteen rows of transition table 380 can be utilized to program next state entries that can point to other rows in the transition table.

FIG. 37 is a diagram of an automaton hardware engine employing memory-efficient transition table indexing in accordance with one novel aspect. Transition table 383 is another embodiment of the transition table in the third stage of the NFA pipeline of FIG. 12. Two NFAs (NFA#1 and NFA#2) are encoded in the same $2^n$-row transition table 383 of FIG. 37, but all rows in the table can be used to contain n-bit entry values that point to other rows in the table. Due to decoder 388, NFA#1 is indexed into the rows of transition table 383 in a first manner, whereas NFA#2 is indexed into the rows of transition table 383 in a second manner. In one example, NFA#1 is indexed with row numbering starting at row "0" at the top of the table sequentially to row "15" at the bottom of the table. Row 384 is the result state for NFA#1 and the bottom row 385 is the terminate state for NFA#1. NFA#2 is indexed with row numbering starting at row "15" at the top of the table sequentially to row "0" at the bottom of the table. Row 386 is the result state for NFA#2 and top row 387 is the terminate state for NFA#2. Assigning a current state value of "14" of both NFAs to be the result state row and assigning a current state value of "15" to be the terminate state row of both NFAs causes: (i) NFA#1 not to be able to utilize the next state entry values stored in the bottom two rows of transition table 383, and (ii) NFA#2 not to be able to utilize the next state entry values stored in the top two rows of transition table 383. However, this also allows: (i) NFA#1 to utilize next state entry values stored in the top two rows of transition table 383, and (ii) NFA#2 to utilize next state entry values stored in the bottom two rows of transition table 383. Therefore, between NFA#1 and NFA#2 all n-bit storage locations in all $2^n$ rows of transition table 383 can be utilized (to store an entry value that points to another row) by one of the NFAs stored in the transition table. Inverting the indexing into the rows of the transition table in this way increases the total possible NFA complexity that can be encoded into a single $2^n$-row transition table, where each n-bit storage location has n bits and no more than n bits, and where each entry value has n bits and no more than n bits.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A Non-deterministic Finite Automaton (NFA) engine, comprising:

a pipeline comprising a plurality of stages, wherein one of the stages comprises a transition table, wherein the transition table is programmable to track up to a maximum of X automaton states such that the transition table could be programmed to simultaneously transition from each of the X automaton states to any of the other X-1 automaton states, wherein a first automaton and a second automaton are both encoded in the transition table, and wherein at least one of the first and second automatons is an NFA that is not a Deterministic Finite Automaton (DFA); and a controller that receives NFA engine commands onto the NFA engine, wherein the controller controls the pipeline in response to the NFA engine commands.

2. The NFA engine of claim 1, wherein the transition table comprises a first plurality of storage locations, wherein each of the first plurality of storage locations stores one of a first plurality of entry values that defines the first automaton and does not define the second automaton, and wherein the transition table further comprises a second plurality of storage locations, wherein each of the second plurality of storage locations stores one of a second plurality of entry values that defines the second automaton and does not define the first automaton.

3. The NFA engine of claim 1, wherein the controller is adapted to receive an NFA engine configuration command, wherein the NFA engine configuration command causes the NFA engine to retrieve information from a memory and to load the information into a part of the transition table without modifying information stored in another part of the transition table.

4. The NFA engine of claim 3, wherein the memory is not a part of the NFA engine.

5. The NFA engine of claim 1, wherein the controller is adapted to receive an NFA engine go command, wherein the NFA engine go command determines an initial state of the first automaton.

6. The NFA engine of claim 1, wherein the controller is adapted to receive an NFA engine go command, wherein the NFA engine go command contains an NFA identifier value.

7. The NFA engine of claim 1, wherein the controller is adapted to receive an NFA engine go command, wherein the NFA engine go command contains a first-byte-to-process value.

8. The NFA engine of claim 1, wherein the controller is adapted to receive an NFA engine go command, wherein the NFA engine go command contains a number-of-bytes-to-process value.

9. The NFA engine of claim 1, wherein the controller is adapted to receive an NFA engine go command, wherein the NFA engine go command includes a result format code, wherein the result format code determines a format of a result value output by the NFA engine.

10. The NFA engine of claim 1, wherein the controller is adapted to receive an NFA engine configuration command, wherein the NFA engine configuration command indicates where a set of entry values is stored in a memory, wherein the memory is not a part of the NFA engine.

11. The NFA engine of claim 1, wherein the controller comprises:

a command FIFO (First In First Out) memory that stores a first NFA engine command and a second NFA engine command, wherein the first NFA engine command causes the transition table to be configured, and wherein the second NFA engine command causes the first automaton to start.

12. The NFA engine of claim 1, wherein the NFA engine outputs a first list of result values from the first automaton, and wherein the NFA engine outputs a second list of result values from the second automaton.

13. The NFA engine of claim 1, wherein the controller is adapted to receive an NFA engine configuration command, wherein one of the stages of the pipeline includes a byte detector, and wherein information in the NFA engine configuration command causes the byte detector to be configured in one of a plurality of selectable ways.

14. The NFA engine of claim 1, wherein one of the stages of the pipeline includes both a hardware byte characterizer as well as a configurable byte detector, wherein the hardware byte characterizer outputs match information to the configurable byte detector.

15. The NFA engine of claim 1, wherein the controller is adapted to receive an NFA engine event generate command, wherein execution of the NFA engine event generate command by the NFA engine causes a processor to be alerted that an NFA has completed.

16. The NFA engine of claim 1, wherein the controller is adapted to receive an NFA engine event generate command, wherein the NFA engine event generate command includes a value that is usable by a processor to determine a reason why the NFA engine alerted the processor.

17. The NFA engine of claim 1, wherein the first automaton is indexed into the transition table in a first manner, and wherein the second automaton is indexed into the transition table in a second manner.

18. The NFA engine of claim 1, wherein the first automaton is indexed into the transition table using non-inverted indexing, and wherein the second automaton is indexed into the transition table using inverted indexing.

19. The NFA engine of claim 1, wherein the transition table is organized into rows of storage locations, wherein each storage location can store a corresponding entry value, wherein each row is programmable to correspond to an automaton state, wherein a first row of the transition table stores entry values for a state of the first automaton but does not store any entry value for the second automaton, and wherein a second row of the transition table stores entry values for a state of the second automaton but does not store any entry value for the first automaton.

20. The NFA engine of claim 1, wherein the transition table is organized into rows of storage locations, wherein each storage location can store a corresponding entry value, wherein each row is programmable to correspond to an automaton state, wherein a first row of the transition table stores entry values for a result state of the first automaton but does not store any entry value for the second automaton, and wherein a second row of the transition table stores entry values for a result state of the second automaton but does not store any entry value for the first automaton.

21. A method comprising:

storing entry values in an automaton transition table located in a stage of a pipeline, wherein the transition table is programmable to track up to a maximum of X automaton states such that the transition table could be programmed to simultaneously transition from each of the X automaton states to any of the other X-1 automaton states, wherein the transition table encodes both a first automaton and a second automaton, and wherein at least one of the first and second automatons is a Non-deterministic Finite Automaton (NFA) that is not a Deterministic Finite Automaton (DFA);

receiving an NFA engine command onto the NFA engine; and controlling the NFA engine based at least in part on the NFA engine command.

22. The method of claim 21, wherein the NFA engine command is received into a command FIFO (First In First Out) memory, wherein the command FIFO memory is a part of the NFA engine, and wherein the NFA engine command contains an NFA identifier value that identifies a selectable one of the first automaton and the second automaton.

23. The method of claim 21, wherein the NFA engine command is received into a command FIFO (First In First Out) memory, wherein the command FIFO memory is a part of the NFA engine, wherein the NFA engine command causes the NFA engine to retrieve entry values from a memory and to load the entry values into the transition table, and wherein the memory is not a part of the NFA engine.

24. The method of claim 21, wherein the NFA engine command is received into a command FIFO (First In First Out) memory, wherein the command FIFO memory is a part of the NFA engine, wherein the NFA engine command includes an address value, wherein the NFA engine uses the address value to write one or more result values into a memory at a location or locations determined at least in part by the address value, and wherein the memory is not a part of the NFA engine.

25. The method of claim 21, wherein the NFA engine command is received into a command FIFO (First In First Out) memory, wherein the command FIFO memory is a part of the NFA engine, wherein the NFA engine command includes a first-byte-to-process value, wherein the NFA engine uses the first-byte-to-process to retrieve a byte stream from a memory, and wherein the memory is not a part of the NFA engine.

26. A Non-deterministic Finite Automaton (NFA) engine, comprising:

means for storing entry values in a transition table, wherein the transition table is programmable to track up to a maximum of X automaton states such that the transition table could be programmed to simultaneously transition from each of the X automaton states to any of the other X-1 automaton states, wherein the entry values stored in the transition table encode both a first automaton and a second automaton, and wherein at least one of the first and second automatons is an NFA that is not a Deterministic Finite Automaton (DFA); and means for receiving NFA engine commands into the NFA engine and for controlling the means for storing at least in part based on the NFA engine commands.

27. The NFA engine of claim 26, wherein the means for storing is a pipeline comprising a plurality of stages, wherein the transition table is a part of one of the stages, and wherein the means for receiving comprises a FIFO (First In First Out) memory and a command interpreter.

28. The NFA engine of claim 26, wherein the NFA engine commands include a first NFA engine command and a second NFA engine command, wherein the first NFA engine command causes the transition table to be loaded with entry values, and wherein the second NFA engine command starts a selectable one of the first and second automatons.

* * * * *